(12) United States Patent
McLaurin et al.

(10) Patent No.: US 9,020,003 B1
(45) Date of Patent: Apr. 28, 2015

(54) GROUP III-NITRIDE LASER DIODE GROWN ON A SEMI-POLAR ORIENTATION OF GALLIUM AND NITROGEN CONTAINING SUBSTRATES

(71) Applicant: Soraa, Inc., Fremont, CA (US)

(72) Inventors: Melvin Barker McLaurin, Santa Barbara, CA (US); James W. Raring, Fremont, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

(21) Appl. No.: 13/801,216

(22) Filed: Mar. 13, 2013

Related U.S. Application Data

(60) Provisional application No. 61/610,906, filed on Mar. 14, 2012.

(51) Int. Cl.
*H01S 5/00* (2006.01)
*H01S 5/343* (2006.01)

(52) U.S. Cl.
CPC .................................. *H01S 5/34333* (2013.01)

(58) Field of Classification Search
CPC ... H01S 5/3201; H01S 5/3202; H01S 5/3216; H01S 5/3219
USPC ...................................................... 372/44.011
See application file for complete search history.

(56) References Cited

U.S. PATENT DOCUMENTS

| | | | |
|---|---|---|---|
| 4,318,058 A | 3/1982 | Mito et al. | |
| 4,341,592 A | 7/1982 | Shortes et al. | |
| 4,860,687 A | 8/1989 | Frijlink | |
| 4,911,102 A | 3/1990 | Manabe et al. | |
| 5,331,654 A | 7/1994 | Jewell et al. | |
| 5,334,277 A | 8/1994 | Nakamura | |
| 5,527,417 A | 6/1996 | Iida et al. | |
| 5,607,899 A | 3/1997 | Yoshida et al. | |
| 5,632,812 A | 5/1997 | Hirabayashi | |
| 5,647,945 A | 7/1997 | Matsuse et al. | |

(Continued)

FOREIGN PATENT DOCUMENTS

| | | |
|---|---|---|
| CN | 101009347 | 3/1987 |
| CN | 1538534 | 10/2004 |

(Continued)

OTHER PUBLICATIONS

Abare, 'Cleaved and Etched Facet Nitride Laser Diodes', IEEE Journal of Selected Topics in Quantum Electronics, vol. 4, No. 3, 1998, pp. 505-509.

(Continued)

*Primary Examiner* — Yuanda Zhang

(74) *Attorney, Agent, or Firm* — Kilpatrick Townsend & Stockton LLP

(57) ABSTRACT

Blue laser diode (LD) structures are grown on a particular subset of semi-polar GaN substrate orientations that offer a distinct set of advantages relative to both (0001), non-polar oriented devices, and alternative semipolar-polar oriented devices operating in the blue regime are disclosed. In particular, the (30-3-1) and (30-31) gallium and nitrogen containing surface orientation and equivalent planes show narrower luminescence spectra than equivalent devices grown on the nonpolar {10-10} m-plane or semipolar planes tilted away from m-plane toward the c-plane between angles of about 0 degrees to about 7 or 8 degrees such as {60-6-1).

25 Claims, 16 Drawing Sheets

(56) References Cited

U.S. PATENT DOCUMENTS

| | | |
|---|---|---|
| 5,821,555 A | 10/1998 | Saito et al. |
| 5,888,907 A | 3/1999 | Tomoyasu et al. |
| 5,951,923 A | 9/1999 | Horie et al. |
| 6,069,394 A | 5/2000 | Hashimoto et al. |
| 6,072,197 A | 6/2000 | Horino et al. |
| 6,153,010 A | 11/2000 | Kiyoku et al. |
| 6,195,381 B1 | 2/2001 | Botez et al. |
| 6,379,985 B1 | 4/2002 | Cervantes et al. |
| 6,451,157 B1 | 9/2002 | Hubacek |
| 6,639,925 B2 | 10/2003 | Niwa et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,920,166 B2 | 7/2005 | Akasaka et al. |
| 7,009,199 B2 | 3/2006 | Hall |
| 7,019,325 B2 | 3/2006 | Li et al. |
| 7,053,413 B2 | 5/2006 | D'Evelyn et al. |
| 7,128,849 B2 | 10/2006 | Setlur et al. |
| 7,303,630 B2 | 12/2007 | Motoki et al. |
| 7,312,156 B2 | 12/2007 | Granneman et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,483,468 B2 | 1/2009 | Tanaka |
| 7,489,441 B2 | 2/2009 | Scheible et al. |
| 7,491,984 B2 | 2/2009 | Koike et al. |
| 7,555,025 B2 | 6/2009 | Yoshida |
| 7,598,104 B2 | 10/2009 | Teng et al. |
| 7,691,658 B2 | 4/2010 | Kaeding et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,044,412 B2 | 10/2011 | Murphy et al. |
| 8,126,024 B1 | 2/2012 | Raring |
| 8,143,148 B1 | 3/2012 | Raring et al. |
| 8,242,522 B1 | 8/2012 | Raring |
| 8,247,887 B1 | 8/2012 | Raring et al. |
| 8,254,425 B1 | 8/2012 | Raring |
| 8,259,769 B1 | 9/2012 | Raring et al. |
| 8,284,810 B1 | 10/2012 | Sharma et al. |
| 8,294,179 B1 | 10/2012 | Raring |
| 8,314,429 B1 | 11/2012 | Raring et al. |
| 8,350,273 B2 | 1/2013 | Vielemeyer |
| 8,351,478 B2 | 1/2013 | Raring et al. |
| 8,355,418 B2 | 1/2013 | Raring et al. |
| 8,416,825 B1 | 4/2013 | Raring |
| 8,422,525 B1 | 4/2013 | Raring et al. |
| 8,427,590 B2 | 4/2013 | Raring et al. |
| 8,451,876 B1 | 5/2013 | Raring et al. |
| 2001/0048114 A1 | 12/2001 | Morita et al. |
| 2002/0027933 A1 | 3/2002 | Tanabe et al. |
| 2002/0085603 A1 | 7/2002 | Okumura |
| 2002/0105986 A1 | 8/2002 | Yamasaki |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0129810 A1 | 7/2003 | Barth et al. |
| 2003/0140846 A1 | 7/2003 | Biwa et al. |
| 2003/0178617 A1 | 9/2003 | Appenzeller et al. |
| 2003/0200931 A1 | 10/2003 | Goodwin |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0146264 A1 | 7/2004 | Auner et al. |
| 2004/0151222 A1 | 8/2004 | Sekine |
| 2004/0233950 A1 | 11/2004 | Furukawa et al. |
| 2004/0247275 A1 | 12/2004 | Vakhshoori et al. |
| 2005/0040384 A1 | 2/2005 | Tanaka et al. |
| 2005/0072986 A1 | 4/2005 | Sasaoka |
| 2005/0168564 A1 | 8/2005 | Kawaguchi et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0286591 A1 | 12/2005 | Lee |
| 2006/0033009 A1 | 2/2006 | Kobayashi et al. |
| 2006/0060131 A1 | 3/2006 | Atanackovic |
| 2006/0077795 A1 | 4/2006 | Kitahara et al. |
| 2006/0078022 A1 | 4/2006 | Kozaki et al. |
| 2006/0086319 A1 | 4/2006 | Kasai et al. |
| 2006/0144334 A1 | 7/2006 | Yim et al. |
| 2006/0193359 A1 | 8/2006 | Kuramoto |
| 2006/0213429 A1 | 9/2006 | Motoki et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0093073 A1 | 4/2007 | Farrell et al. |
| 2007/0101932 A1 | 5/2007 | Schowalter et al. |
| 2007/0110112 A1 | 5/2007 | Sugiura |
| 2007/0153866 A1 | 7/2007 | Shchegrov et al. |
| 2007/0163490 A1 | 7/2007 | Habel et al. |
| 2007/0184637 A1 | 8/2007 | Haskell et al. |
| 2007/0217462 A1 | 9/2007 | Yamasaki |
| 2007/0242716 A1 | 10/2007 | Samal et al. |
| 2007/0259464 A1 | 11/2007 | Bour et al. |
| 2007/0272933 A1 | 11/2007 | Kim et al. |
| 2007/0280320 A1 | 12/2007 | Feezell et al. |
| 2008/0029152 A1 | 2/2008 | Milshtein et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0164578 A1 | 7/2008 | Tanikella et al. |
| 2008/0173735 A1 | 7/2008 | Mitrovic et al. |
| 2008/0191223 A1 | 8/2008 | Nakamura et al. |
| 2008/0198881 A1 | 8/2008 | Farrell et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0058532 A1 | 3/2009 | Kikkawa et al. |
| 2009/0061857 A1 | 3/2009 | Kazmi |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0316116 A1 | 12/2009 | Melville et al. |
| 2009/0321778 A1 | 12/2009 | Chen et al. |
| 2010/0001300 A1 | 1/2010 | Raring et al. |
| 2010/0006546 A1 | 1/2010 | Young et al. |

(56) References Cited

U.S. PATENT DOCUMENTS

| | | |
|---|---|---|
| 2010/0006873 A1 | 1/2010 | Raring et al. |
| 2010/0096615 A1 | 4/2010 | Okamoto et al. |
| 2010/0140630 A1 | 6/2010 | Hamaguchi et al. |
| 2010/0140745 A1 | 6/2010 | Khan et al. |
| 2010/0195687 A1 | 8/2010 | Okamoto et al. |
| 2010/0220262 A1 | 9/2010 | DeMille et al. |
| 2010/0276663 A1 | 11/2010 | Enya et al. |
| 2010/0295054 A1 | 11/2010 | Okamoto et al. |
| 2010/0309943 A1 | 12/2010 | Chakraborty et al. |
| 2010/0316075 A1 | 12/2010 | Raring et al. |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0073888 A1 | 3/2011 | Ueno et al. |
| 2011/0075694 A1 | 3/2011 | Yoshizumi et al. |
| 2011/0103418 A1 | 5/2011 | Hardy et al. |
| 2011/0129669 A1 | 6/2011 | Fujito et al. |
| 2011/0150020 A1 | 6/2011 | Haase et al. |
| 2011/0164637 A1 | 7/2011 | Yoshizumi et al. |
| 2011/0180781 A1 | 7/2011 | Raring et al. |
| 2011/0182056 A1 | 7/2011 | Trottier et al. |
| 2011/0188530 A1 | 8/2011 | Lell et al. |
| 2011/0216795 A1 | 9/2011 | Hsu et al. |
| 2011/0247556 A1 | 10/2011 | Raring et al. |
| 2011/0281422 A1 | 11/2011 | Wang et al. |
| 2011/0286484 A1 | 11/2011 | Raring et al. |
| 2012/0104359 A1 | 5/2012 | Felker et al. |
| 2012/0178198 A1 | 7/2012 | Raring et al. |
| 2012/0314398 A1 | 12/2012 | Raring et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |

FOREIGN PATENT DOCUMENTS

| | | |
|---|---|---|
| CN | 1702836 | 11/2005 |
| CN | 1781195 | 5/2006 |
| CN | 101099245 | 1/2008 |
| CN | 101171692 | 4/2008 |
| CN | 101079463 | 9/2009 |
| JP | 3-287770 | 12/1991 |
| JP | 2007-173467 | 7/2007 |
| WO | WO 2004/084275 | 9/2004 |
| WO | WO 2008/041521 | 4/2008 |
| WO | WO 2010/120819 | 10/2010 |

OTHER PUBLICATIONS

Adesida et al., 'Characteristics of chemically assisted ion beam etching of gallium nitride', Applied Physics Letters, vol. 65, No. 7, 1994, pp. 889-891.

Behfar et al., 'Progress in Etched Facet Technology for GaN and Blue Lasers', Proc. of SPIE., vol. 6473, 64731F, 2007, pp. 1-8.

Founta et al., 'Anisotropic Morphology of Nonpolar a-Plane GaN Quantum Dots and Quantum Wells', Journal of Applied Physics, vol. 102, vol. 7, 2007, pp. 074304-1-074304-6.

Franssila, 'Tools for CVD and Epitaxy', Introduction to Microfabrication, 2004, pp. 329-336.

Khan, 'Cleaved Cavity Optically Pumped InGaN—GaN Laser Grown on Spinel Substrates', Applied Physics Letters, vol. 69, No. 16, 1996, pp. 2417-2420.

Lin et al., 'Influence of Separate Confinement Heterostructure Layer on Carrier Distribution in InGaAsP Laser Diodes With Nonidentical Multiple Quantum Wells', Japanese Journal of Applied Physics, vol. 43, No. 10, 2004, pp. 7032-7035.

Okamoto et al., 'Continuous-Wave Operation of m-Plane InGaN Multiple Quantum Well Laser Diodes', Japanese Journal of Applied Physics, vol. 46, No. 9, 2007, pp. L187-L189.

Okamoto et al., 'High-Efficiency Continuous-Wave Operation of Blue-Green Laser Diodes Based on Nonpolar mPlane Gallium Nitride', The Japan Society of Applied Physics, Applied Physics, Express 1, 2008, pp. 072201-1-072201-3.

Park, 'Crystal Orientation Effects on Electronic Properties of Wurtzite InGaN/GaN Quantum Wells', Journal of Applied Physics, vol. 91, No. 12, 2002, pp. 9903-9908.

International Preliminary Report & Written Opinion of PCT Application No. PCT/US2011/037792, dated Sep. 8, 2011, 13 pages total.

International Preliminary Report & Written Opinion of PCT Application No. PCT/US2011/060030 dated Mar. 21, 2012, 11 pgs. total.

Romanov et al., 'Strain-Induced Polarization in Wurtzite III-Nitride Semipolar Layers', Journal of Applied Plysics, vol. 100, 2006, pp. 023522-1 through 023522-10.

Schoedl, 'Facet Degradation of GaN Heterostructure Laser Diodes', Journal of Applied Physics, vol. 97, Issue 12, 2006, pp. 123102-1-123102-8.

Tyagi et al., 'Semipolar (1011) InGaN/GaN Laser Diodes on Bulk GaN Substrates', Japanese Journal of Applied Physics, vol. 46, No. 19, 2007, pp. L444-L445.

Zhong et al., 'Demonstration of High Power Blue-Green Light Emitting Diode on Semipolar (1122) Bulk GaN Substrate', Electronics Letters, vol. 43, No. 15, 2007, pp. 825-826.

USPTO Office Action for U.S. Appl. No. 12/481,543 dated Jun. 27, 2011.

USPTO Office Action for U.S. Appl. No. 12/482,440 dated Feb. 23, 2011.

USPTO Office Action for U.S. Appl. No. 12/482,440 dated Aug. 12, 2011.

USPTO Office Action for U.S. Appl. No. 12/484,924 dated Apr. 14, 2011.

USPTO Office Action for U.S. Appl. No. 12/484,924 dated Oct. 31, 2011.

USPTO Office Action for U.S. Appl. No. 12/491,169 dated Oct. 22, 2010.

USPTO Office Action for U.S. Appl. No. 12/491,169 dated May 11, 2011.

USPTO Office Action for U.S. Appl. No. 12/497,289 dated Feb. 2, 2012.

USPTO Notice of Allowance for U.S. Appl. No. 12/497,289 dated May 22, 2012.

USPTO Office Action for U.S. Appl. No. 12/502,058 dated Dec. 8, 2010.

USPTO Office Action for U.S. Appl. No. 12/502,058 dated Aug. 19, 2011.

USPTO Notice of Allowance for U.S. Appl. No. 12/502,058 dated Apr. 16, 2012.

USPTO Notice of Allowance for U.S. Appl. No. 12/502,058 dated Jul. 19, 2012.

USPTO Office Action for U.S. Appl. No. 12/534,838 dated May 3, 2011.

USPTO Office Action for U.S. Appl. No. 12/534,838 dated Jan. 13, 2012.

USPTO Office Action for U.S. Appl. No. 12/534,838 dated Mar. 20, 2012.

USPTO Notice of Allowance for U.S. Appl. No. 12/534,838 dated Jun. 8, 2012.

USPTO Office Action for U.S. Appl. No. 12/573,820 dated Mar. 2, 2011.

USPTO Office Action for U.S. Appl. No. 12/573,820 dated Oct. 11, 2011.

USPTO Office Action for U.S. Appl. No. 12/749,466 dated Jun. 29, 2011.

USPTO Office Action for U.S. Appl. No. 12/749,466 dated Feb. 3, 2012.

USPTO Office Action for U.S. Appl. No. 12/749,466 dated Jul. 3, 2012.

USPTO Notice of Allowance for U.S. Appl. No. 12/749,466 dated Jan. 2, 2013.

USPTO Office Action for U.S. Appl. No. 12/759,273 dated Nov. 21, 2011.

USPTO Office Action for U.S. Appl. No. 12/759,273 dated Jun. 26, 2012.

(56) References Cited

OTHER PUBLICATIONS

USPTO Office Action for U.S. Appl. No. 12/762,269 dated Oct. 12, 2011.
USPTO Notice of Allowance for U.S. Appl. No. 12/762,269 dated Apr. 23, 2012.
USPTO Office Action for U.S. Appl. No. 12/762,271 dated Dec. 23, 2011.
USPTO Office Action for U.S. Appl. No. 12/762,271 dated Jun. 6, 2012.
USPTO Notice of Allowance for U.S. Appl. No. 12/762,271 dated Aug. 8, 2012.
USPTO Notice of Allowance for U.S. Appl. No. 12/762,278 dated Nov. 7, 2011.
USPTO Office Action for U.S. Appl. No. 12/778,718 dated Nov. 25, 2011.
USPTO Notice of Allowance for U.S. Appl. No. 12/778,718 dated Apr. 3, 2012.
USPTO Notice of Allowance for U.S. Appl. No. 12/778,718 dated Jun. 13, 2012.
USPTO Office Action for U.S. Appl. No. 12/787,343 dated Dec. 17, 2012.
USPTO Notice of Allowance for U.S. Appl. No. 12/787,343 dated Jun. 10, 2013.
USPTO Office Action for U.S. Appl. No. 12/789,303 dated Sep. 24, 2012.
USPTO Notice of Allowance for U.S. Appl. No. 12/789,303 dated Dec. 21, 2012.
USPTO Office Action for U.S. Appl. No. 12/859,153 dated Sep. 25, 2012.
USPTO Office Action for U.S. Appl. No. 12/859,153 dated Feb. 26, 2013.
USPTO Office Action for U.S. Appl. No. 12/868,441 dated Apr. 30, 2012.
USPTO Office Action for U.S. Appl. No. 12/868,441 dated Dec. 18, 2012.
USPTO Office Action for U.S. Appl. No. 12/880,803 dated Feb. 22, 2012.
USPTO Notice of Allowance for U.S. Appl. No. 12/880,803 dated Jul. 18, 2012.
USPTO Office Action for U.S. Appl. No. 12/883,093 dated Mar. 13, 2012.
USPTO Office Action for U.S. Appl. No. 12/883,093 dated Aug. 3, 2012.
USPTO Notice of Allowance for U.S. Appl. No. 12/883,093 dated Nov. 21, 2012.
USPTO Office Action for U.S. Appl. No. 12/884,993 dated Mar. 16, 2012.
USPTO Office Action for U.S. Appl. No. 12/884,993 dated Aug. 2, 2012.
USPTO Notice of Allowance for U.S. Appl. No. 12/884,993 dated Nov. 26, 2012.
USPTO Office Action for U.S. Appl. No. 12/942,817 dated Feb. 20, 2013.
USPTO Office Action for U.S. Appl. No. 12/995,946 dated Mar. 28, 2012.
USPTO Office Action for U.S. Appl. No. 12/995,946 dated Jan. 29, 2013.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/046,565 dated Nov. 7, 2011.
USPTO Office Action for U.S. Appl. No. 13/046,565 dated Feb. 2, 2012.
USPTO Office Action for U.S. Appl. No. 13/046,565 dated Apr. 13, 2012.
USPTO Office Action for U.S. Appl. No. 13/046,565 dated Jul. 19, 2012.
USPTO Notice of Allowance for U.S. Appl. No. 13/108,645 dated Jan. 28, 2013.
USPTO Office Action for U.S. Appl. No. 13/114,806 dated Apr. 12, 2013.
USPTO Office Action for U.S. Appl. No. 13/291,922 dated Feb. 20, 2013.
USPTO Office Action for U.S. Appl. No. 13/291,922 dated Jun. 18, 2013.
USPTO Office Action for U.S. Appl. No. 13/354,639 dated Nov. 7, 2012.
USPTO Notice of Allowance for U.S. Appl. No. 13/354,639 dated Dec. 14, 2012.
USPTO Office Action for U.S. Appl. No. 13/425,354 dated Feb. 14, 2013.
USPTO Office Action for U.S. Appl. No. 13/548,635 dated Jun. 14, 2013.
USPTO Office Action for U.S. Appl. No. 13/548,312 dated Mar. 12, 2013.
USPTO Office Action for U.S. Appl. No. 13/606,894 dated Feb. 5, 2013.
USPTO Notice of Allowance for U.S. Appl. No. 13/606,894 dated May 24, 2013.
Feezell et al. 'Development of nonpolar and semipolar InGaN/GaN visible light-emitting diodes', MRS Bulletin, vol. 34, May 2009, pp. 318-323.
Khan, 'Cleaved Cavity Optically Pumped InGaN-GaN Laser Grown on Spinel Substrates', Applied Physics Letters, vol. 69, No. 16, 1996, pp. 2417-2420.
International Search Report of PCT Application No. PCT/US2010/030939, dated Jun. 16, 2010, 9 pages total.
International Preliminary Report & Written Opinion of PCT Application No. PCT/US2011/037792, dated Dec. 6, 2012, 8 pages total.
Communication from the Chinese Patent Office re 200980134723.8 dated Jun. 27, 2013, 19 pages.
USPTO Office Action for U.S. Appl. No. 12/502,058 dated Dec. 8, 2010, 15 pages.
USPTO Office Action for U.S. Appl. No. 12/502,058 dated Aug. 19, 2011, 13 pages.
USPTO Notice of Allowance for U.S. Appl. No. 12/502,058 dated Apr. 16, 2012, 10 pages.
USPTO Notice of Allowance for U.S. Appl. No. 12/502,058 dated Jul. 19, 2012, 13 pages.
USPTO Office Action for U.S. Appl. No. 12/534,838 dated May 3, 2011, 12 pages.
USPTO Office Action for U.S. Appl. No. 12/534,838 dated Jan. 13, 2012, 14 pages.
USPTO Office Action for U.S. Appl. No. 12/534,838 dated Mar. 20, 2012, 13 pages.
USPTO Notice of Allowance for U.S. Appl. No. 12/534,838 dated Jun. 8, 2012, 8 pages.
USPTO Office Action for U.S. Appl. No. 12/749,466 dated Jun. 29, 2011 20 pages.
USPTO Office Action for U.S. Appl. No. 12/749,466 dated Feb. 3, 2012, 16 pages.
USPTO Office Action for U.S. Appl. No. 12/749,466 dated Jul. 3, 2012, 18 pages.
USPTO Notice of Allowance for U.S. Appl. No. 12/749,466 dated Jan. 2, 2013, 8 pages.
USPTO Office Action for U.S. Appl. No. 12/759,273 dated Nov. 21, 2011, 10 pages.
USPTO Office Action for U.S. Appl. No. 12/759,273 dated Jun. 26, 2012, 10 pages.
USPTO Office Action for U.S. Appl. No. 12/762,269 dated Oct. 12, 2011, 12 pages.
USPTO Notice of Allowance for U.S. Appl. No. 12/762,269 dated Apr. 23, 2012, 8 pages.
USPTO Office Action for U.S. Appl. No. 12/762,271 dated Dec. 23, 2011, 12 pages.
USPTO Office Action for U.S. Appl. No. 12/762,271 dated Jun. 6, 2012, 13 pages.
USPTO Notice of Allowance for U.S. Appl. No. 12/762,271 dated Aug. 8, 2012, 9 pages.

(56) References Cited

OTHER PUBLICATIONS

USPTO Notice of Allowance for U.S. Appl. No. 12/762,278 dated Nov. 7, 2011, 11 pages.
USPTO Office Action for U.S. Appl. No. 12/778,718 dated Nov. 25, 2011, 12 pages.
USPTO Notice of Allowance for U.S. Appl. No. 12/778,718 dated Apr. 3, 2012, 14 pages.
USPTO Notice of Allowance for U.S. Appl. No. 12/778,718 dated Jun. 13, 2012, 7 pages.
USPTO Office Action for U.S. Appl. No. 12/868,441 dated Apr. 30, 2012, 12 pages.
USPTO Office Action for U.S. Appl. No. 12/868,441 dated Dec. 18, 2012, 34 pages.
USPTO Notice of Allowance for U.S. Appl. No. 12/868,441 dated Sep. 18, 2013, 13 pages.
USPTO Office Action for U.S. Appl. No. 12/883,093 dated Mar. 13, 2012, 10 pages.
USPTO Office Action for U.S. Appl. No. 12/883,093 dated Aug. 3, 2012, 13 pages.
USPTO Notice of Allowance for U.S. Appl. No. 12/883,093 dated Nov. 21, 2012, 12 pages.
USPTO Office Action for U.S. Appl. No. 12/884,993 dated Mar. 16, 2012, 13 pages.
USPTO Office Action for U.S. Appl. No. 12/884,993 dated Aug. 2, 2012, 15 pages.
USPTO Notice of Allowance for U.S. Appl. No. 12/884,993 dated Nov. 26, 2012, 5 pages.
USPTO Office Action for U.S. Appl. No. 13/114,806 dated Apr. 12, 2013, 22 pages
USPTO Office Action for U.S. Appl. No. 13/114,806 dated Aug. 26, 2013, 22 pages.
USPTO Office Action for U.S. Appl. No. 13/291,922 dated Feb. 20, 2013, 10 pages.
USPTO Office Action for U.S. Appl. No. 13/291,922 dated Jun. 18, 2013, 9 pages.
USPTO Office Action for U.S. Appl. No. 13/354,639 dated Nov. 7, 2012, 9 pages.
USPTO Notice of Allowance for U.S. Appl. No. 13/354,639 dated Dec. 14, 2012, 8 pages.

GROUP III-NITRIDE LASER DIODE GROWN ON A SEMI-POLAR ORIENTATION OF GALLIUM AND NITROGEN CONTAINING SUBSTRATES

This application claims the benefit under 35 U.S.C. §119 (e) of U.S. Provisional Application No. 61/610,906 filed on Mar. 14, 2012, which is incorporated by reference in its entirety.

BACKGROUND

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were unpreferred as well.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal, which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature, which limits their application.

From the above, it is seen that techniques for improving optical devices is highly desired.

BRIEF SUMMARY

Embodiments of the present disclosure is directed to optical devices and related methods. More particularly, embodiments of the present disclosure provides a method and device for emitting electromagnetic radiation using semipolar gallium containing substrates such as GaN, AlN, InN, InGaN, AlGaN, and AlInGaN, and others configured on the {30-3-1} family of planes. Merely by way of example, the invention can be applied to optical devices, lasers, light emitting diodes, displays (e.g., laser), general lighting, solar cells, photoelectrochemical water splitting and hydrogen generation, photodetectors, integrated circuits, and transistors, among other devices.

According to embodiments of the present disclosure, blue laser diode (LD) structures are grown on a particular subset of semi-polar GaN substrate orientations that offer a distinct set of advantages relative to both (0001), non-polar oriented devices, and alternative semipolar-polar oriented devices operating in the blue regime. In particular, the (30-3-1) gallium and nitrogen containing surface orientation and equivalent planes show narrower luminescence spectra than equivalent devices grown on the nonpolar {10-10} m-plane or semipolar planes tilted away from m-plane toward the -c-plane between angles of ~0 degrees to approximately 7 or 8 degrees such as {60-6-1}. However, the {30-3-1} planes are more resistant to thermal degradation of the light emitting InGaN layers during the subsequent growth of p-layers positioned above the light emitting layers and will allow for growth of more highly strained active regions than alternative semi-polar planes with higher inclinations angles of greater than about 13 or about 14 degrees away from the (10-10) plane toward the -c-plane (e.g. {20-21}) without the formation of extended defects due to the {30-3-1} planes higher resistance to the formation of misfit dislocations due to glide of dislocations on the (0001) plane.

In an embodiment, the present disclosure provides an optical device. The device includes a gallium and nitrogen containing substrate member having a semipolar crystalline surface region characterized by {30-3-1} or offcut surface configuration. The device has a laser stripe region formed overlying a portion of the semipolar crystalline surface region, the laser stripe region being characterized by a cavity orientation substantially parallel to the projection of the c-direction, the laser strip region having a first end and a second end. The device also has a first facet provided on the first end of the laser stripe region and a second facet provided on the second end of the laser stripe region. The device also has an n-type cladding region overlying the substrate region and an active region comprising at least one active layer region overlying the n-type cladding region. The device also has a p-type cladding region overlying the active layer region. The active layer region is configured to emit electromagnetic radiation characterized by a wavelength ranging from about 430 nm to about 475 nm.

In an alternative embodiment, the present disclosure provides an optical device. The device also includes a gallium and nitrogen containing substrate member having a semipolar crystalline surface region characterized by {30-3-1} or offcut surface configuration. The device also includes a laser stripe region formed overlying a portion of the semipolar crystalline surface region. The laser stripe region is characterized by a cavity orientation substantially parallel to the projection of the c-direction. The laser strip region has a first end and a second end. The device has a first facet provided on the first end of the laser stripe region. The device includes a second facet provided on the second end of the laser stripe region. The device an n-type cladding region is overlying the substrate region. The n-type cladding region is characterized by an AlN mol fraction of less than about 2%. The device also has an active region comprising at least one active layer region overlying the n-type cladding region. In an embodiment, the total thickness of the active layers is greater than or equal to 10 nm. The device has a p-type cladding region overlying the active layer region.

In yet an alternative embodiment, the present disclosure provides an optical device. The device has a gallium and nitrogen containing substrate member having a semipolar crystalline surface configuration is characterized by {30-3-1} or an offcut surface configuration. The device has a laser stripe region formed overlying a portion of the semipolar crystalline surface region. The laser stripe region is characterized by a cavity orientation substantially parallel to the projection of the c-direction. The laser strip region has a first end and a second end. The device has a first facet provided on the first end of the laser stripe region. The device has a second facet provided on the second end of the laser stripe region. The device also has an n-type cladding region overlying the substrate region, the n-type cladding region being characterized by an AlN mol fraction of less than about 2%. The device has an active region comprising at least one active layer region overlying the n-type cladding region. The total thickness of the active layers is greater than or equal to 10 nm. The active layer comprises a quantum well region or a double hetero-structure region. The device has a p-type cladding region overlying the active layer region. The p-type cladding region is characterized by an AlN mol fraction of less than about 2%. The quantum well regions are configured to emit electromagnetic radiation characterized by a wavelength ranging from about 430 nm to about 475 nm.

Still further, the present disclosure provides an optical device. The device has a gallium and nitrogen containing substrate member having a semipolar crystalline surface region characterized by {30-3-1} or offcut surface configuration. The device has a laser stripe region formed overlying a portion of the semipolar crystalline surface region. The laser stripe region is characterized by a cavity orientation substantially parallel to the projection of the c-direction. The laser stripe region has a first end and a second end. The device has a first facet provided on the first end of the laser stripe region and a second facet provided on the second end of the laser stripe region. The device has an n-type cladding region overlying the substrate region. The n-type cladding region is characterized by an AlN mol fraction of less than about 2%. The device has an active region comprising at least one active layer region overlying the n-type cladding region. The total thickness of the active layers is greater than or equal to 20 nm. The device has p-type cladding region overlying the active layer region. The p-type cladding region is characterized by an AlN mol fraction of less than about 2%. The quantum well regions are configured to emit electromagnetic radiation characterized by a wavelength ranging from about 430 to about 470 nm.

Moreover, the present disclosure provides an optical device. The device has a gallium and nitrogen containing substrate member having a semipolar crystalline surface region characterized by {30-3-1} surface configuration. The device a laser stripe region formed overlying a portion of the semipolar crystalline surface region. The laser stripe region is characterized by a cavity orientation substantially parallel to the projection of the c-direction. Preferably, the laser strip region has a first end and a second end. The device has a first facet provided on the first end of the laser stripe region and a second facet provided on the second end of the laser stripe region. The device has an n-type cladding region. The device has an active region comprising at least three quantum well regions overlying the n-type cladding region. Each of the three quantum well regions has a thickness of at least 5 nm. The device has a p-type cladding region overlying the quantum well region. The p-type cladding region is substantially free from aluminum bearing species.

Still further, the present disclosure provides a method for manufacturing an optical device. The method includes providing a gallium and nitrogen containing substrate member having a semipolar crystalline surface region characterized by {30-3-1} or offcut surface configuration. The method includes forming an n-type cladding region over the substrate member. The method also includes forming an active region comprising at least one active layer region overlying the n-type cladding region at a first temperature range. The active layer region is configured to emit electromagnetic radiation characterized by a wavelength ranging from about 435 nm to about 470 nm. The active layer region comprises a quantum well region. The method includes forming a p-type cladding region overlying the active region using a second temperature range of at least 100 or 150 degrees Celsius greater than an upper limit of the first temperature range provided during formation of the active layer region.

In one or more examples, the present method and device provides the following:
1. Wurtzite group III-Nitride laser diode composed of layers of various compositions of InGaAlN.
2. Optical device consists of (AlIn)GaN p-type layers and n-type layers cladding a light emitting region comprised of light emitting layers and cladding layers of various compositions of AlInGaN.
3. Device grown either homoepitaxially on a free-standing (AlIn)GaN crystal, hetero-epitaxially on a non (AlIn)GaN substrates with a wurtzite crystal structure (e.g. ZnO), or hetero-epitaxially on a non-wurtzite substrate.
4. Epitaxial surface of device during growth of active region is oriented relative to the InAlGaN crystal such that the epitaxial coincides with one of the members of the {30-31} or {30-3-1} family of crystal planes, and would preferably coincide with the {30-3-1}. Small deviations ("offcut") are acceptable between the {30-3-1} plane and the epitaxial surface.
   a. Acceptable component of offcut toward [0001] is ≤±3.5°; preferably ≤±2.5°; more preferably ≤±1°
   b. Offcut can be less than or equal to ≤±10° toward [11-20], but it could be others.
5. LDs operating in the 410-480 nm range; preferably embodied as lasing between 430 nm and 470 nm.
6. LEDs operating in the 410-480 nm range operating at high current density.

Of course, there can be variations.

In an embodiment, the present method and device includes a gallium and nitrogen containing substrate configured on a surface orientation of (30-3-1), which is offcut from m-plane by about −10 degrees toward (0001), which is preferred for a blue laser diode device. In one or more embodiments, the following features are included.

1. For active region designs sufficient for laser diode grown on (30-3-1), the EL and PL spectra are much narrower in the blue region compared to a broad m-plane configured device. This indicates that the material is more homogenous and thus will provide a higher material gain than m-plane or even planes miscut by −5 or −7 degrees off of m-plane toward (0001) such as (60-6-1).

2. m-plane offers preferred characteristics because it allows the growth of thick p-cladding regions above the active region needed in laser diodes at relatively high temperatures (e.g., 100 to 200 Degrees Celsius higher than the active region) without substantial degradation to the active region. Additionally, m-plane also enables growth of thick active regions in the blue emission region, which are preferred for high modal gain laser diodes. However, as explained above, the PL and EL emission spectra are broad in the blue regime indicating that material is not homogenous and will not provide maximum gain.

As explained, by mis-cutting off of m-plane toward (000-1) or (0001) at about 8, 9, or degrees reaching the (30-3-1) or (30-31) planes, it is possible to achieve narrow emission spectra in the blue emission regime of 430 to 470 or 480 nm. However, if the miscut angle is increased much further than (30-3-1) toward (20-2-1) which is at about 15 degrees off of m-plane, it becomes difficult to grow thick active regions without degradation of the light emission or internal efficiency because defects form at lower strain values. Moreover, on the (20-2-1) plane growing the thick p-cladding needed in laser diodes and/or growing, hot p-cladding results in substantial degradation to the light emission properties of the material. This characteristic indicates that growth of a highly optimized laser diodes may be difficult.

3. Basically, the orientations around (30-3-1) offers an unexpected benefit of enabling bright emission in the blue regime using thick active regions designs and hot p-clad techniques while maintaining a narrow emission spectrum. These characteristics are favorable for laser diodes.

This (30-3-1) plane is also highly polarized and very bright. It is preferred to grow the p-clad hot to achieve high crystal quality, low resistance cladding layers. In other embodiments, the present method and device includes (30-3-1) with off orientations ranging from plus 1-2 degrees to negative 2-3 degrees toward m-plane.

Benefits are achieved over pre-existing techniques using embodiments of the present disclosure. In particular, embodiments of the present disclosure enable a cost-effective optical device for laser applications. In an embodiment, the present optical device can be manufactured in a relatively simple and cost effective manner. Depending upon the embodiment, the present apparatus and method can be manufactured using conventional materials and/or methods according to one of ordinary skill in the art. The present method and devices includes cleaved facets (but can also include etched facets), thick QW layers, thin barrier layers, substantially Al-free cladding layers for the p-clad, n-clad, or both clads, operable in the 395-420 nm range, 420-440 nm range, 440-475 nm range, 475-505 nm range, and 505-535 nm range, but preferably in the 440-475 nm range. As used herein the thick active regions (e.g., summation of all light emitting layers within the device structures, including QW and double hetero-structures) can achieve higher model confinement leading to higher model gain, and an ability to grow laser diode structures that may be free from AlGaN cladding regions, InAlGaN cladding regions, or aluminum containing cladding regions all together, which limits c-plane devices. Depending upon the embodiment, one or more of these benefits may be achieved. These and other benefits may be described throughout the present specification and more particularly below.

Embodiments of the present disclosure achieves these benefits and others in the context of known process technology. However, a further understanding of the nature and advantages of embodiments of the present disclosure may be realized by reference to the latter portions of the specification and attached drawings.

DETAILED DESCRIPTION

Figure 1:
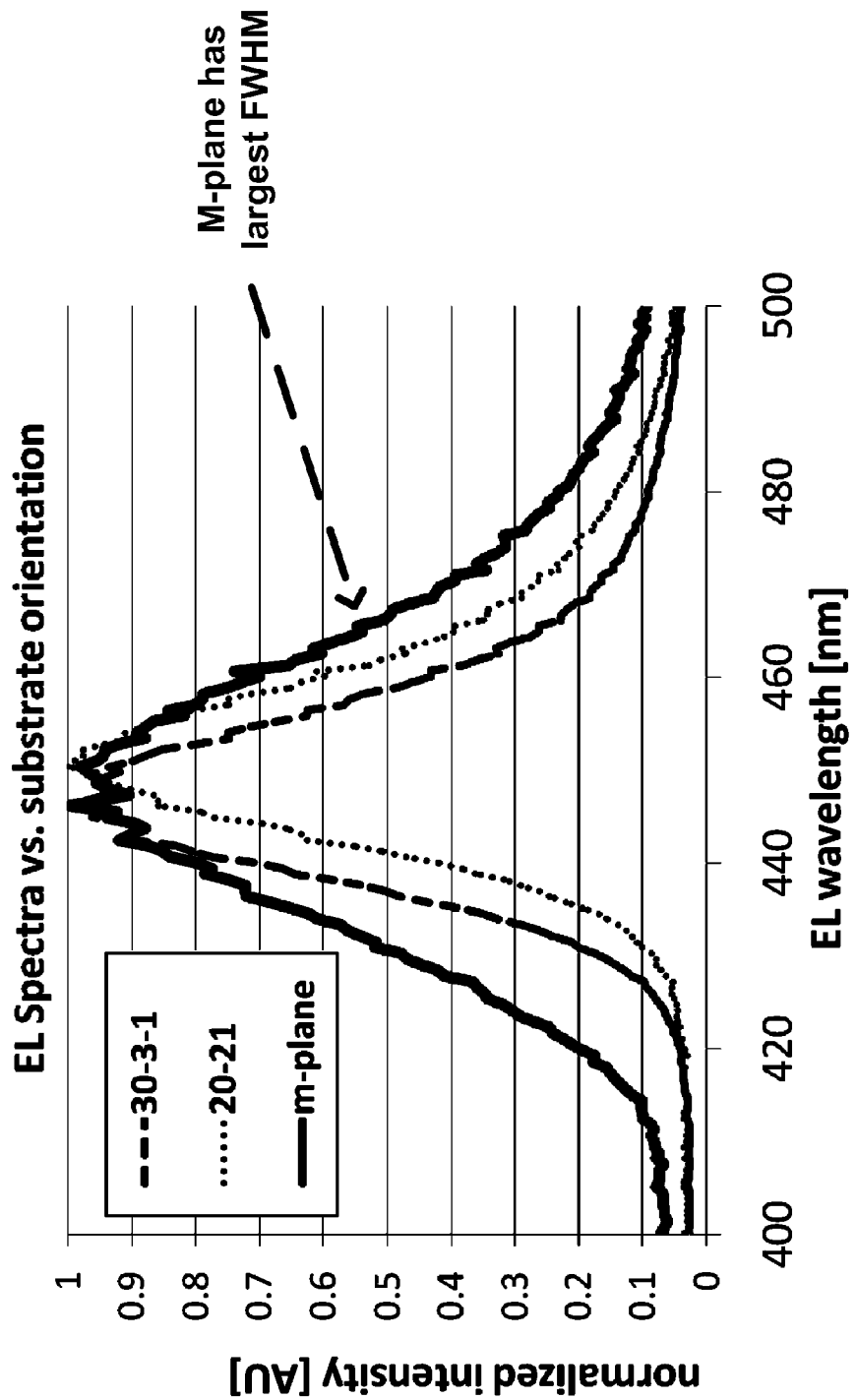
FIG. 1 shows exemplary electroluminescence spectra from InGaN/GaN MQW LDs grown on various substrate orientations and emitting in the blue spectral range according to embodiments of the present disclosure. As can be seen, the blue m-plane orientation shows the broadest spectrum indicating possible issues in the material such as inhomogeneities. However, semi-polar planes appear to provide narrower spectral width in the blue region.

Embodiments of the present disclosure is directed to optical devices and related methods. More particularly, embodiments of the present disclosure provides a method and device for emitting electromagnetic radiation using semipolar gallium containing substrates such as GaN, AlN, InN, InGaN, AlGaN, and AlInGaN, and others configured on the {30-3-1} family of planes or offcuts of these planes. Merely by way of example, the invention can be applied to optical devices, lasers, light emitting diodes, displays (e.g., laser), general lighting, solar cells, photoelectrochemical water splitting and hydrogen generation, photodetectors, integrated circuits, and transistors, among other devices.

Lasers are useful and important. They are used in many applications and recently visible lasers have reached performance thresholds that make them useful in the field of video displays and video projectors. While there are several technologies that can produce visible lasers, solid-state diode lasers (LDs) emitting at the desired wavelength have a good chance of minimizing system size while maximizing wall-plug efficiency (WPE). While diode lasers emitting with high WPE in the red region of the visible spectrum have been available for years it is only recently that blue and green LDs have become good enough to consider for many high power and space and efficiency conscious applications.

Blue LDs currently available commercially are based on the semiconductor GaN grown with device layers oriented parallel to the (0001) plane of the GaN crystal. Recently, blue LDs based on other crystallographic orientations of GaN have been demonstrated. The so-called "non-polar" orientations [(10-10) or "m-plane" and (11-20) or "a-plane"] offer an advantage over c-plane based devices in that the heterostructures that provide for electron and hole confinement do not result in piezoelectric or spontaneous electric fields due to differences in polarization between various AlInGaN alloys used in the devices. In c-plane devices the internal fields result in band-tilting that spatially separates electron and hole bound states and reduces the thickness of InGaN quantum wells that can be used. Smaller quantum wells result in less modal overlap, increased spontaneous emission lifetimes which respectively reduce the gain and increase the threshold current densities of the devices. Growing in non-polar orientations results in better electron and hole overlap even for wide wells, resulting in higher gain and threshold current densities. Non-polar orientations also have the advantage that photon emission in the plane of the device is not isotropic, such that laser stripes can be oriented parallel to the direction of preferred emission to help decrease threshold currents even further.

While the (0001) and non-polar planes are orthogonal, there is a broad class of low-index planes that are not orthogonal to the (0001). This invention is based on the understanding that blue LD structures grown on a particular subset of semipolar GaN substrate orientations offer a distinct set of advantages to both (0001) and non-polar oriented devices. Table 1 lists several of the orientations relevant to this invention along with the approximate tilt of these planes away from the (10-10) plane in both the [0001] and [11-20] directions.

TABLE 1

Orientations of non-polar and semi-polar planes relevant to this invention. All orientations are listed with respect to the non-polar m-plane orientation.

| Plane | Misorientation from m-plane toward [0001] | Misorientation from m-plane toward [11-20] |
|---|---|---|
| (10-10) | 0° | 0° |
| (60-61) | 5.073° | 0° |
| (40-41) | 7.58° | 0° |
| (30-31) | 10.067° | 0° |
| (30-3-1) | −10.067° | 0° |
| (50-52) | 12.03° | 0° |
| (50-5-2) | −12.03° | 0° |
| (20-21) | 14.912° | 0° |
| (20-2-1) | −14.912° | 0° |

In an example, m-plane oriented InGaN/(AlIn)GaN devices exhibit a broadening of luminescence spectra in the range of wavelengths spanning from approximately 415 nm to 470 nm. This is not optimal for providing gain in laser diode active regions since when all other factors are equivalent using a gain medium with a narrower spontaneous emission spectrum will result in higher gain and consequently higher WPE. Growth on semi-polar planes derived from the m-plane results in devices with narrower full width at half maximum (FWHM) of luminescence spectra.

Figure 2:
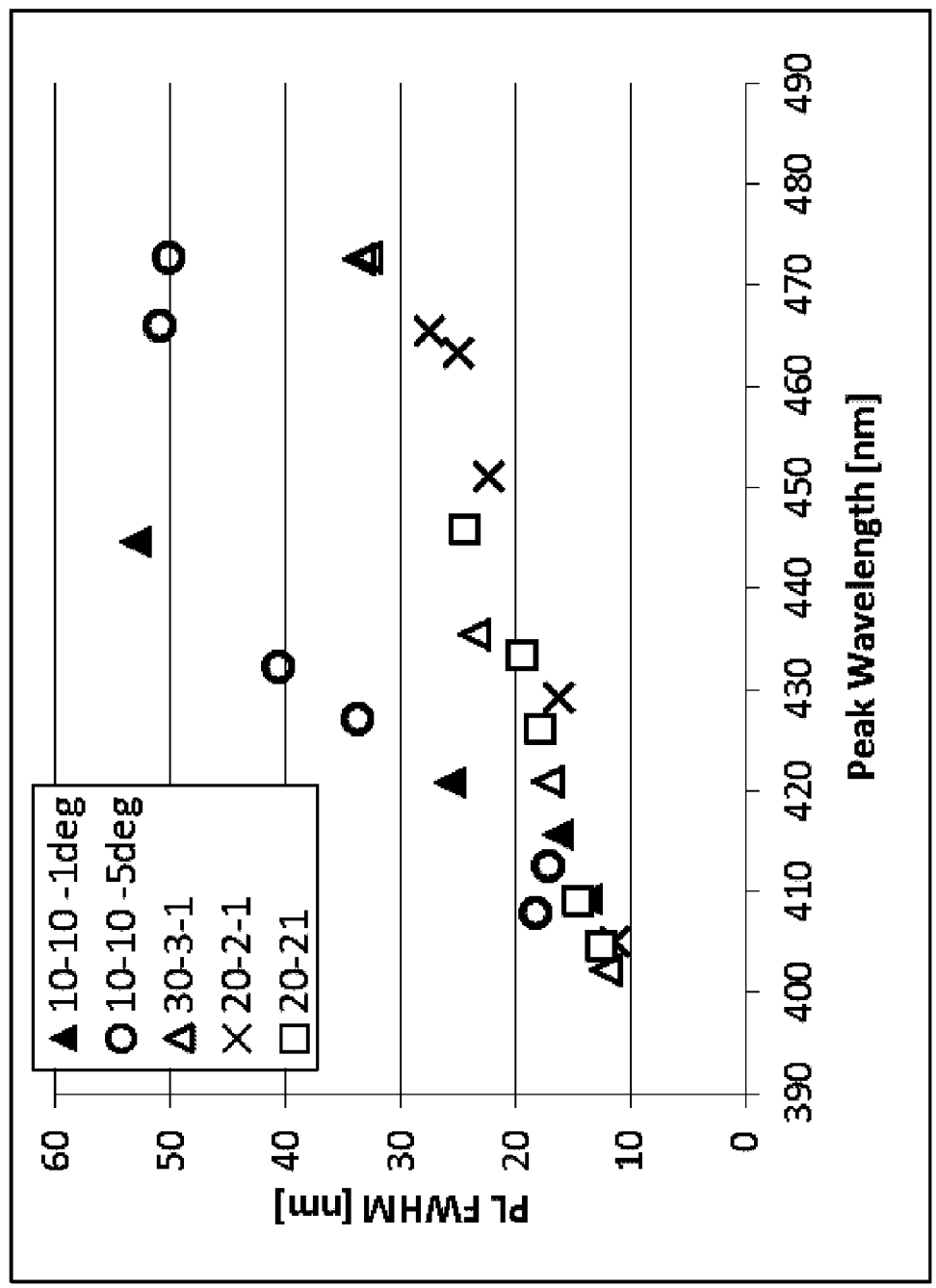
FIG. 2 shows exemplary full width at half maximum (FWHM) values of photoluminescence spectra from GaN/InGaN/GaN double-heterostructure grown on substrates of various non-polar and semi-polar orientations according to embodiments of the present disclosure. The m-plane (10-10) and (60-6-1) (m-plane with offcut of −5 degrees toward c-plane) demonstrate the widest FWHM while the semipolar planes with the higher inclination angle off of m-plane such as (30-3-1), (20-21) and (20-2-1) show narrower spectra.

FIG. 1 shows electroluminescence spectra from (10-10), (30-31) and (20-21) oriented laser diodes emitting in the range of 450-455 nm. The semi-polar planes exhibit much narrower electroluminescence spectra characteristic which implies a better material quality and potential for higher gain in the laser diode. However, the improvement in FWHM breadth is not observed for all semi-polar orientations of GaN. FIG. 2 shows FWHM of PL spectra measured on GaN/InGaN/GaN double heterostructures grown on several orientations of bulk GaN. As can be seen in FIG. 2 small misorientations of the substrate away from (10-10), here ~5° toward [000-1] also specified as (60-6-1) does not result in significant reductions in FWHM. Larger misorientations, such as ~10° and ~15° (corresponding roughly to (30-3-1) and (20-21) and (20-2-1)) show a dramatic reduction in FWHM, which is favorable.

Figure 3A:
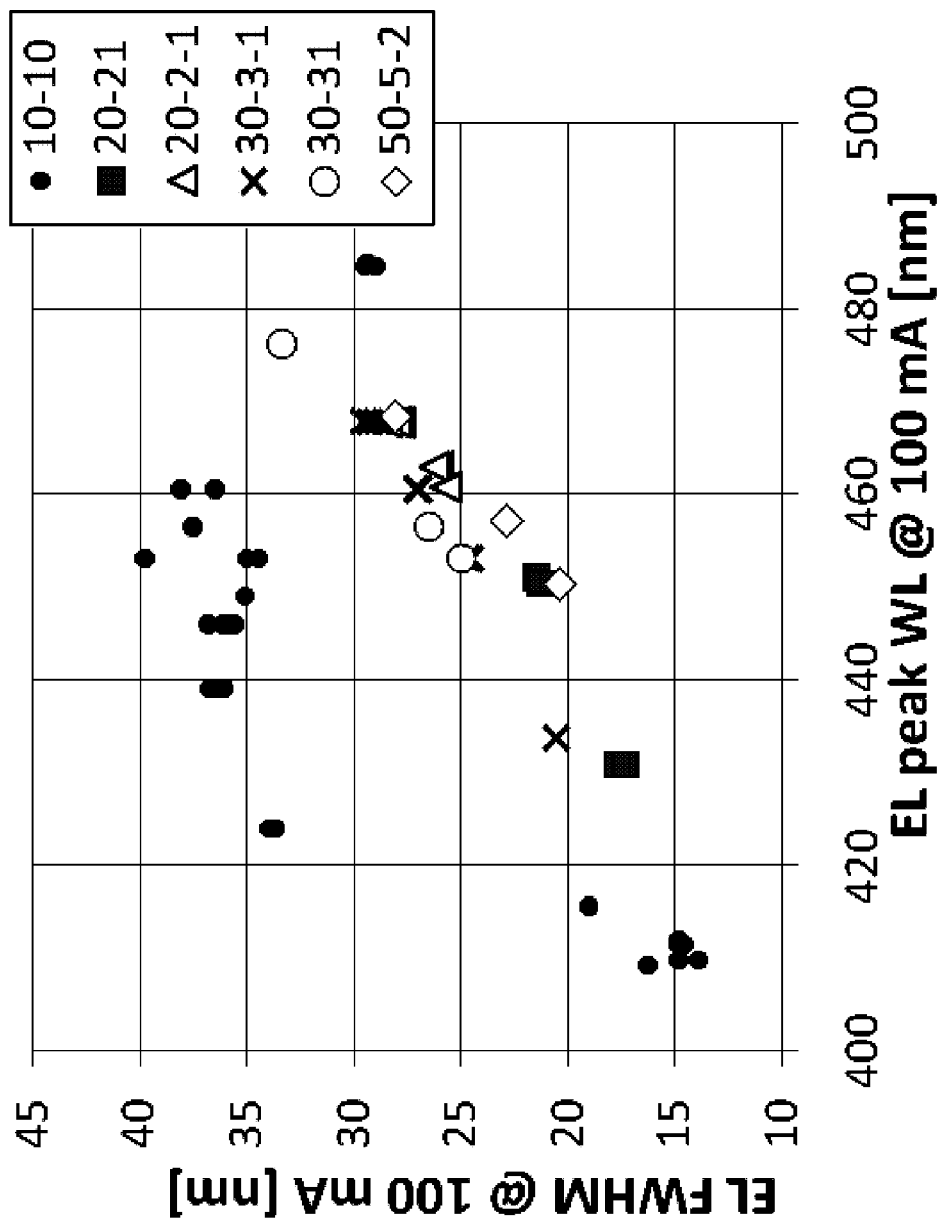
FIGS. 3A and 3B show exemplary FWHM of electroluminescence spectra from blue MQW active regions with similar designs grown in two different MOCVD reactors on substrates of various non-polar and semi-polar orientations according to embodiments of the present disclosure. (A) shows m-plane, (20-2±1), (30-3±1) and (50-5-2) oriented devices grown in MOCVD reactor 'X'. (B) shows LDs on m-plane, (60-61) and m-plane miscut by −7° [near the (40-4-1)] toward the c-axis devices grown in MOCVD reactor 'Y'. For small offcut angles there is no improvement in FWHM relative to m-plane.
Figure 3B:
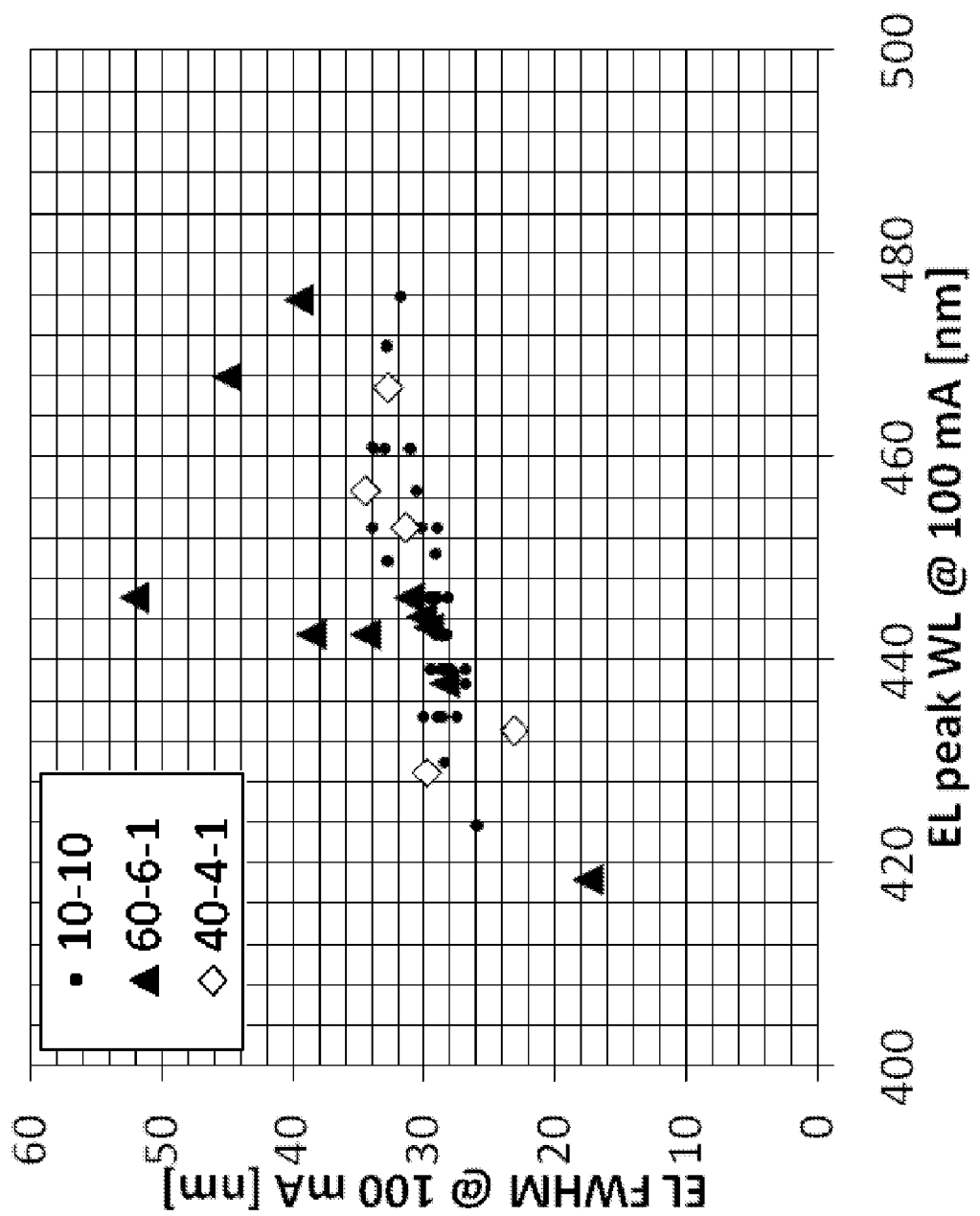
Figure 4A:
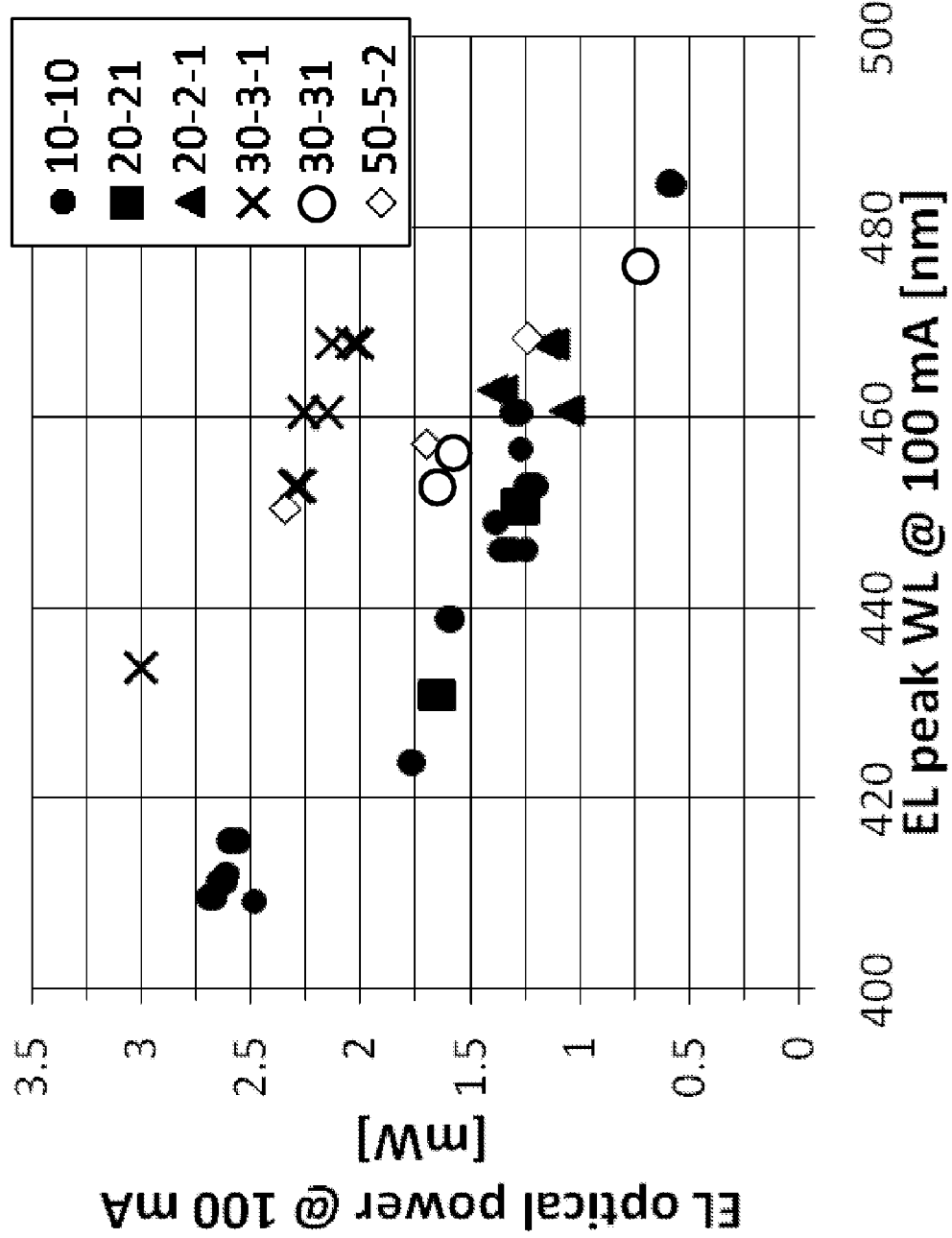
FIGS. 4A and 4B show exemplary optical power for blue devices grown with similar active regions on several orientations of GaN in two different MOCVD reactors according to embodiments of the present disclosure. (A) shows m-plane, (20-2±1), (30-3±1) and (50-5-2) oriented devices grown in MOCVD reactor 'X'. (B) shows LDs on m-plane, (60-61) and m-plane miscut by −7° [near the (40-4-1)] toward the c-axis devices grown in MOCVD reactor 'Y'. Light collection geometry is kept constant for all measurements.
Figure 4B:
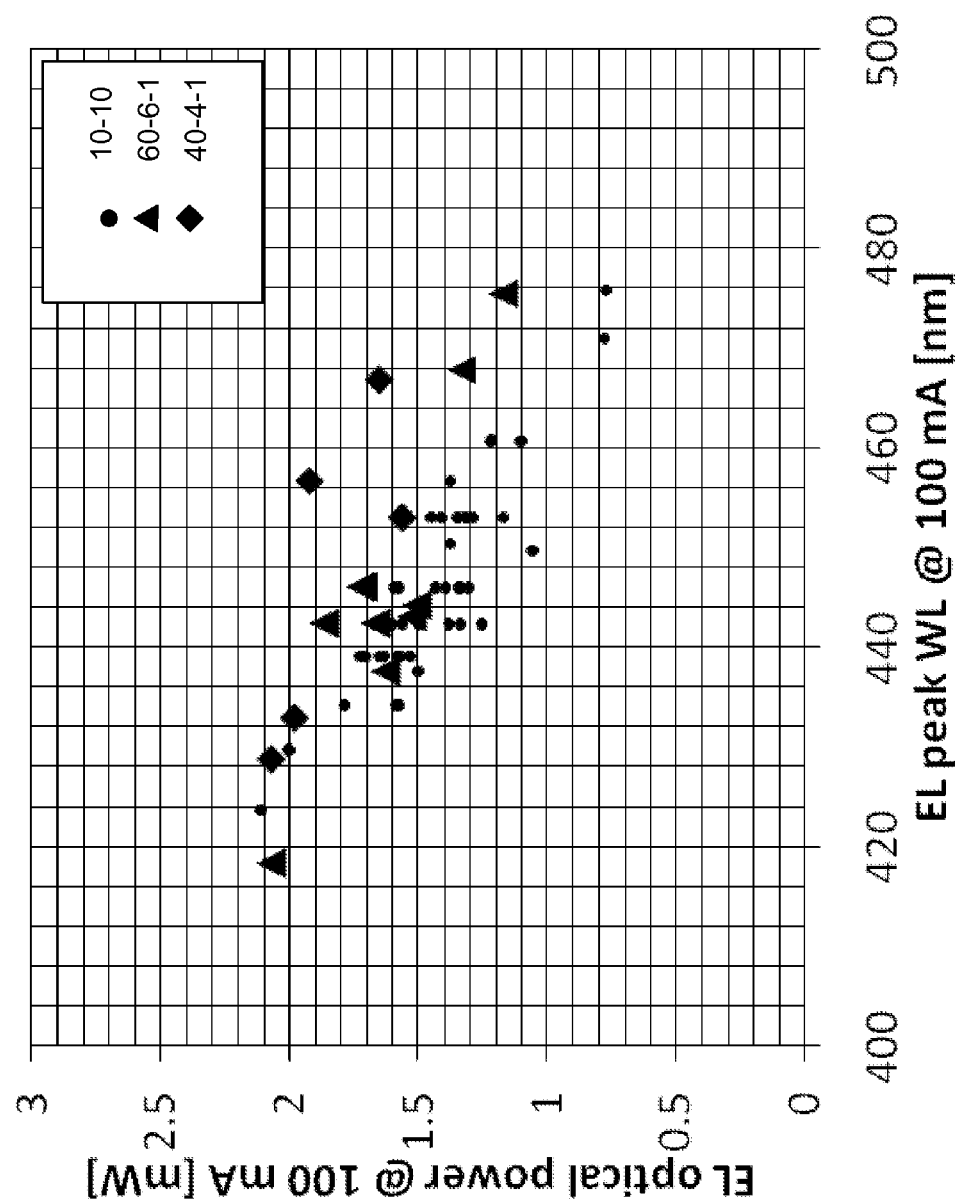

This narrowing of the FWHM with substrate inclination away from (10-10) is also observed in electroluminescence. FIGS. 3A and 3B show FWHM from multiple quantum well (MQW) laser diodes grown on various orientations of bulk GaN with similar active region dimensions; two different MOCVD reactors were used to grow these samples. M-plane devices from each reactor are given in the respective plots as baselines for device FWHM. In the wavelength range of interest for blue LDs (i.e. approximately 430-470 nm) there is little difference in FWHM between (30-3-1), (30-31), (50-5-2), (20-2-1) and (20-21) oriented devices, substrate orientations with smaller misorientations (−5 and −7 degrees toward the [0001] direction) from m-plane show broad FWHM similar to those observed in m-plane devices. FIGS. 4A and 4B show emitted optical power from the devices in FIG. 3 when under test at 100 mA drive current. All devices in this figure contained full laser MQW structures using at least 5 quantum wells of at least 5 nm in thickness. Further, all devices contained full thickness p-layers needed for laser diodes above the MQW active region. Collection geometries were the same for all devices, and device brightness was maintained across the various orientations. As can be seen in the figure, for a blue MQW structure with 5 relatively thick quantum wells and full thickness p-layers, the (30-3-1) plane provides the highest electroluminescence power compared to the other planes with similar MQW active regions and full thickness p-layers. While the large increase in brightness for (30-3-1) relative to the other orientations may be due to an inherent difference in extraction efficiency, the similar trends in performance relative to color indicate the (30-3-1) oriented films are of at least comparable material quality to the other orientations. This interpretation of the data is supported by the low-temperature PL IQE measurements shown in FIG. 5. Here a blue (30-3-1) MQW structure with the same MQW design as the devices in FIGS. 3 and 4 has been subjected to photo-luminescence measurements over a range of temperatures. Carriers were excited resonantly in the MQW via a laser. Trap-assisted non-radiative recombination is quenched at low temperatures, and at low excitations Auger recombination is not a significant contributor to the overall recombination rate. We can therefore take the low temperature PL external quantum efficiency (EQE, i.e. light output divided by laser power density) as being proportional to IQE, which is approximately 100% at low temperatures and laser powers. The room-temperature PL-IQE derived from this measurement is approximately 75-80%, indicating the material quality of the (30-3-1) InGaN/GaN MQW structures is high.

Figure 5:
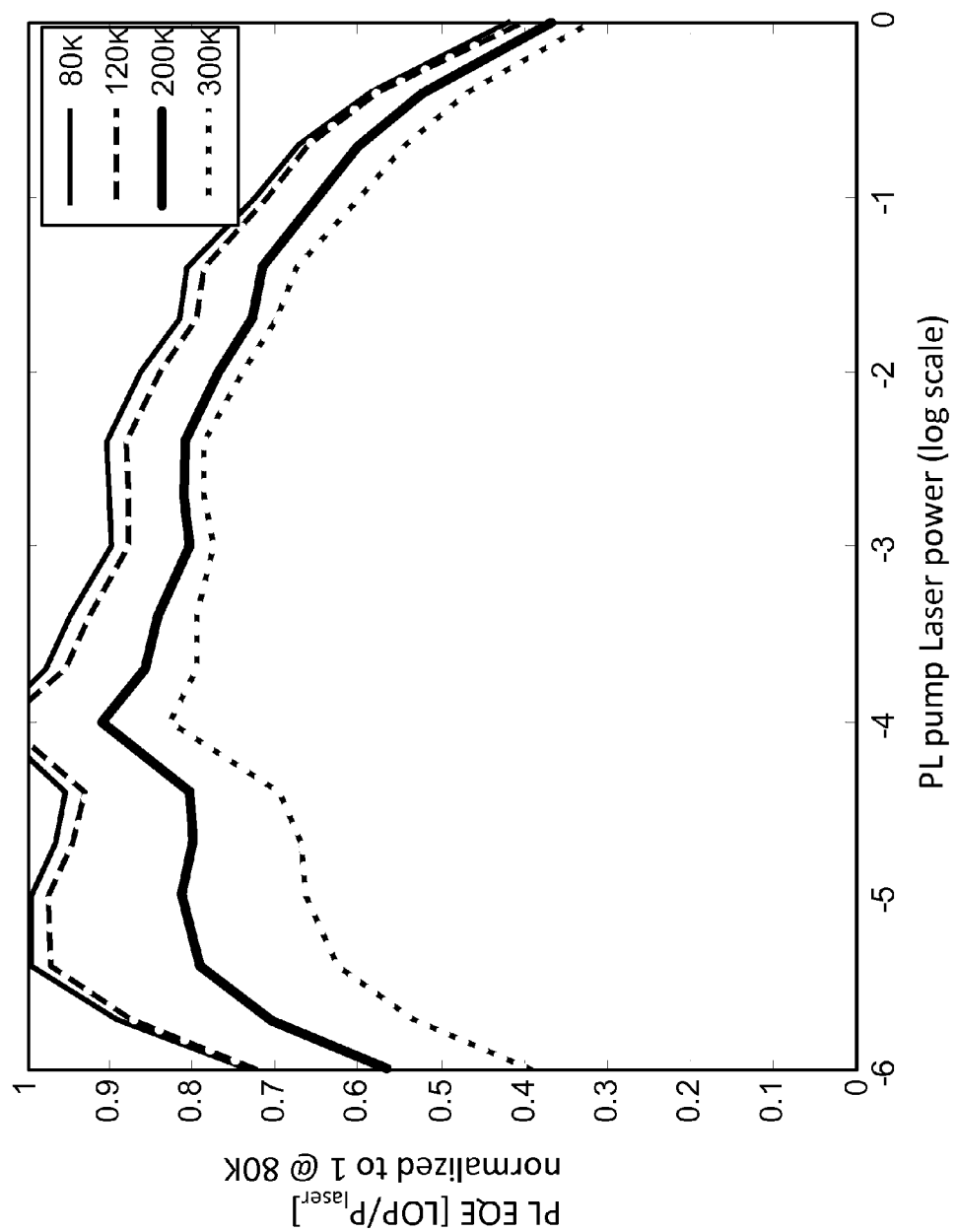
FIG. 5 shows exemplary photoluminescence (PL) EQE from a (30-3-1) multi-quantum well structure according to embodiments of the present disclosure. PL EQE is calculated by dividing the PL light output (LOP) by the pump laser intensity. Trap-assisted non-radiative recombination is quenched at low temperatures, such that IQE can be assumed to be approximately 100% at low temperatures and carrier densities (i.e. low excitation) where Auger recombination is insignificant. Assuming extraction efficiency is independent of temperature, the IQE can be inferred at other temperatures and pump powers. Here the (30-3-1) sample is showing a peak IQE of approx. 75-80% at room temperature, implying that the material quality in these structures is very good.
Figure 6A:
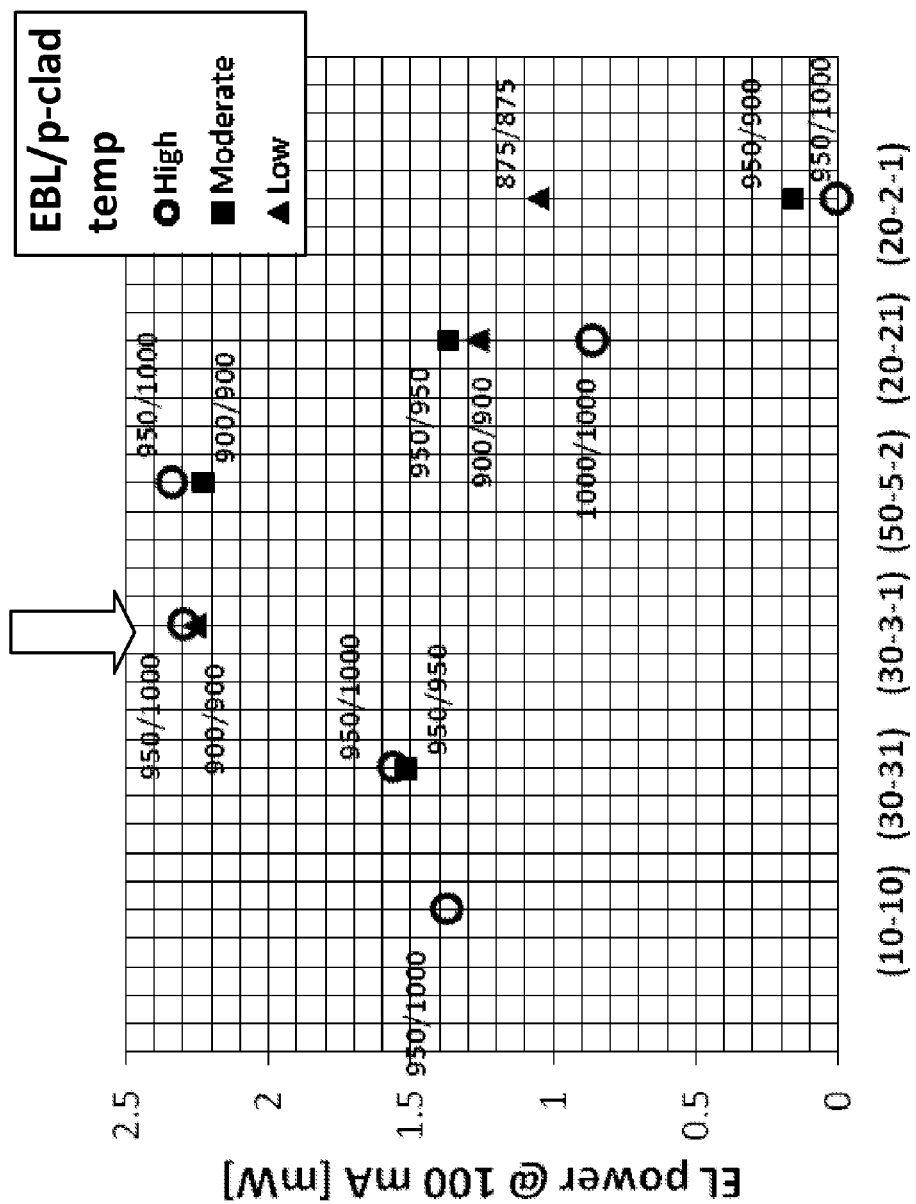
FIGS. 6A and 6B show exemplary values of electroluminescence power for blue devices grown with similar active regions on several orientations of GaN according to embodiments of the present disclosure. Light collection geometry is kept constant for all measurements. (30-3-1) oriented devices show less reduction in output power with increase in p-layer growth temperature and quantum well thickness. (A) devices with quantum well thicknesses ~50-60 Å. Electron blocking layer and p-GaN growth temperatures are listed in degrees Celsius. (B) comparison of devices with quantum well thicknesses of (~60 Å (thick) ~30 Å (thin) for both high and low p-GaN temperatures from A. (30-3-1) and (50-5-2) show the most resistance to output power degradation with the growth of hot EBL/p-layer growth and with thick active region.
Figure 6B:
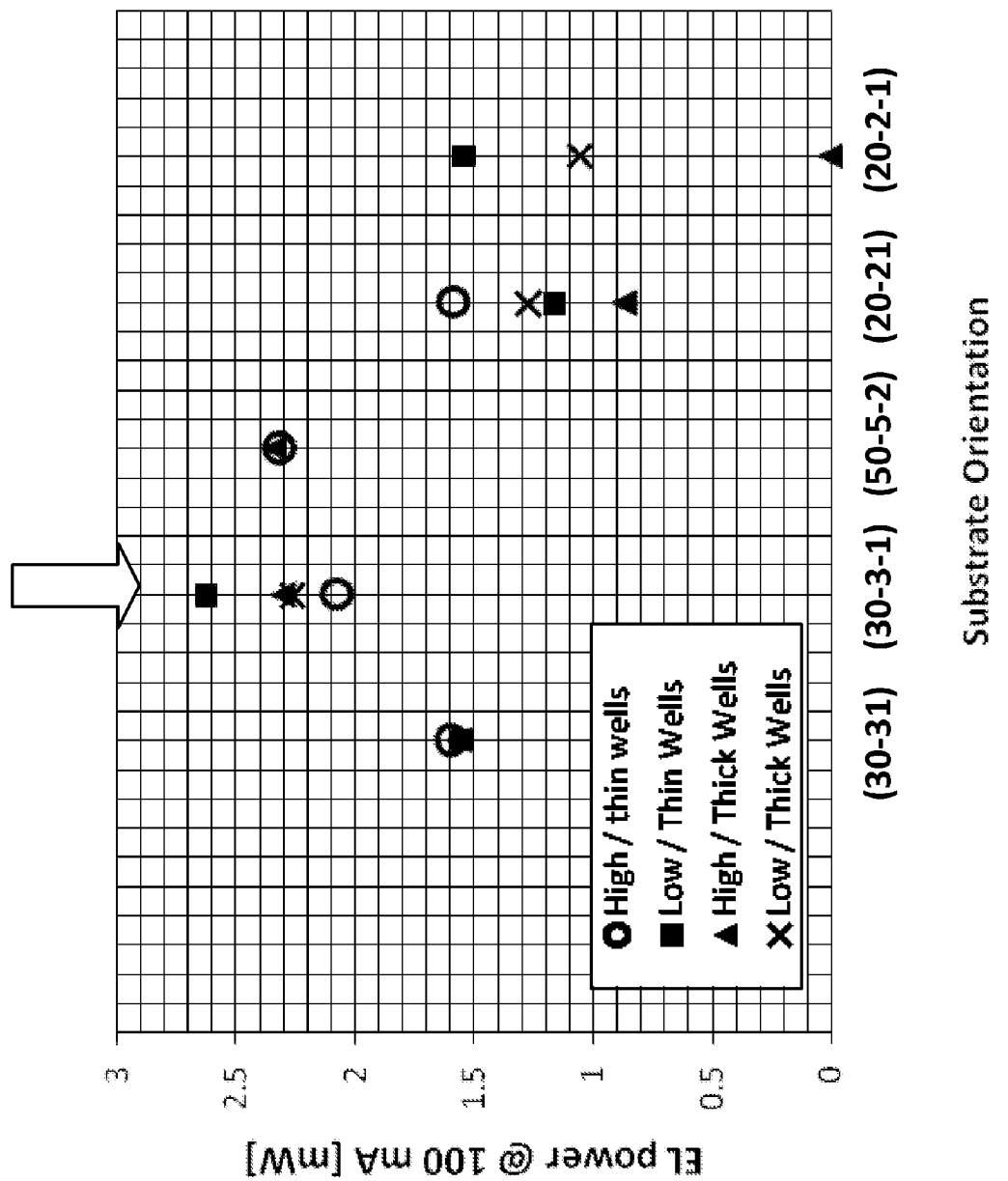

A major consideration when choosing an optimal plane for III-Nitride laser diodes is the effect of thermal budget on the material quality of the light-emitting InGaN layers. Laser diodes require relatively thick layers of material above the active region in order to spatially separate the optical modes from the surface of the device structure. This is done to lower loss in the device, as surface roughness can lead to scattering of light and absorption in the metal contacts and heavily doped GaN contact layers can be significant. P-type cladding layer material quality is linked to both growth rate and growth temperature, resulting in limits on how fast and how hot the p-GaN must be grown. P-type GaN and AlGaN electron blocking layers (EBLs) are typically grown at higher temperatures than the InGaN containing active region. During this dwell time at higher temperature the InGaN is often observed to degrade in materials quality resulting in higher non-radiative recombination rates. While the FWHM of spontaneous emission tends to decrease with offcut from the (10-10) plane, there is a decrease in resistance to thermal budget related degradation in performance when the offcut increases beyond a certain angle. FIG. 5 shows the electroluminescence power for blue devices grown with similar active regions on several orientations of GaN. The light collection geometry was kept constant for all measurements. FIG. 6A shows devices with quantum well thicknesses ~50-60 Å along with the temperature of the electron blocking layer and p-GaN growth listed in degrees Celsius. (30-3-1), (30-31) and (50-5-2) [all offcut by 10-12 degrees from the m-plane] oriented devices show less reduction in external efficiency with increase in p-layer growth temperature and quantum well thickness. FIG. 6B shows a comparison of devices with "thick" and "thin" quantum wells (~60 Å "thick" vs. ~30 Å "thin") for both high and low p-GaN temperatures from FIG. 6A. At high p-layer growth temperatures the (30-3-1), (30-31) and (50-5-2) oriented devices remain equally bright for thin and thick quantum wells while there is a clear degradation in EL efficiency with quantum well thickness and p-GaN temperature for (20-21) and (20-2-1) devices. Table 2 summarizes the data contained in FIG. 6A.

TABLE 2

Electroluminescence power from blue (450-460 nm) semi-polar MQW structures at bias currents of 100 mA. The test setup and light extraction geometry is constant across the several devices. Optical power measurements indicates that light emitting structures grown on (20-21) and (20-2-1) degrade more severely than structures grown on (30-3-1) during the subsequent growth of electron blocking layers and p-cladding layers at various temperatures.

| (30-31) | | (30-3-1) | | (50-5-2) | | (20-21) | | (20-2-1) | |
| --- | --- | --- | --- | --- | --- | --- | --- | --- | --- |
| EBL/p-clad temp | Optical Power (mW) | EBL/p-clad temp | Optical Power (mW) | EBL/p-clad temp | Optical Power (mW) | EBL/p-clad temp | Optical Power (mW) | EBL/p-clad temp | Optical Power (mW) |
| 950/1000 | 1.57 | 950/1000 | 2.31 | 950/1000 | 2.34 | 950/1000 | 0.87 | 1000/1000 | 0.01 |
| 950/950 | 1.51 | 900/900 | 2.27 | 950/950 | 2.23 | 950/950 | 1.37 | 950/900 | 0.31 |
| | | | | | | 900/900 | 1.27 | 875/875 | 1.06 |

Finally, while increasing the offcut of the substrate away from the m-plane results in narrower FWHM, it also results in a higher propensity for formation of misfit dislocations at strained interfaces. Misfits can form either as loops generated at the growth surface or from threading dislocations that slip under stress. The lowest energy slip systems in the wurtzite III-Nitrides lie on the basal (0001) plane. In the case of (0001) oriented films, the basal plane is parallel to the strained interface, and there is no resolved shear stress on the basal plane to drive dislocation slip. In non-polar films, the basal plane is normal to the strained interface and no component of misfit stress lies parallel to the basal plane. In semi-polar oriented films, however, the basal plane is inclined with respect to strained interfaces, and there is a resolved shear stress present on the basal plane that increases as the inclination of the basal plane approaches 45 degrees.

Figure 7:
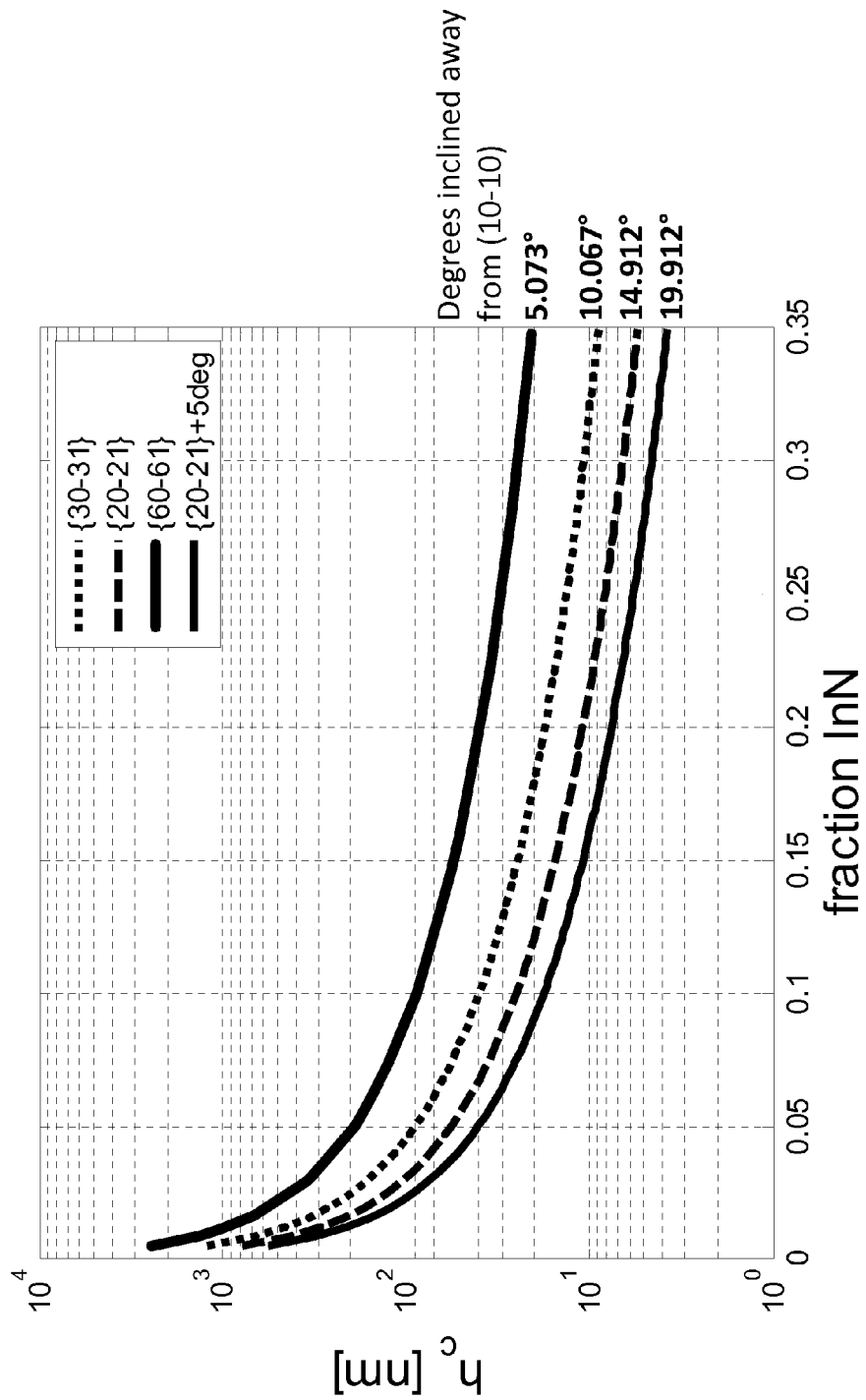
FIG. 7 shows exemplary plots of calculated critical thicknesses for misfit dislocation formation in three orientations of semipolar InGaN films grown on GaN substrates according to embodiments of the present disclosure. [After Romanov et al. JAP 109, 103522 (2011)]
Figure 8:
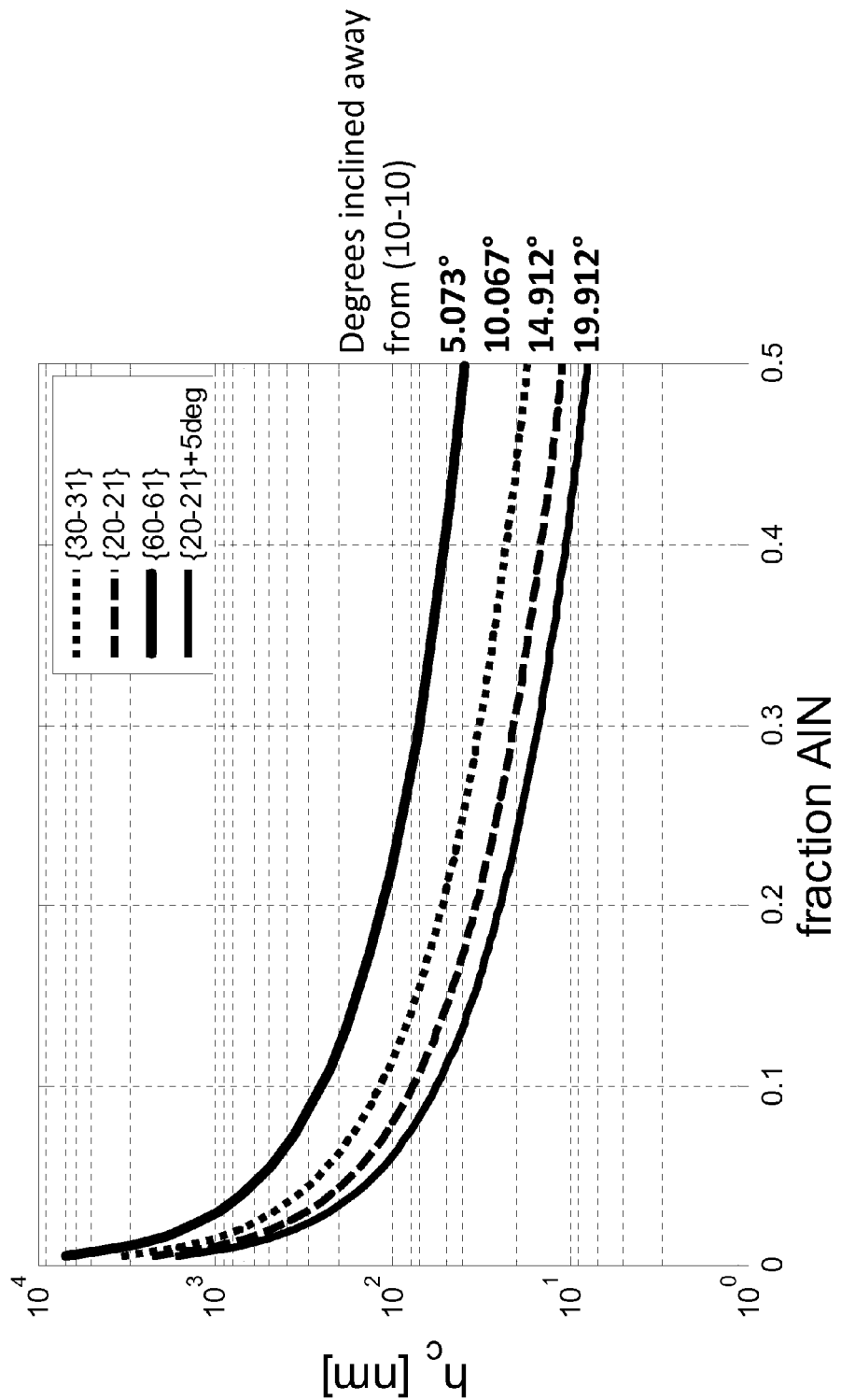
FIG. 8 shows exemplary plots of calculated critical thicknesses for misfit dislocation formation in three orientations of semipolar AlGaN films grown on GaN substrates according to embodiments of the present disclosure. [After Romanov et al. JAP 109, 103522 (2011)]

FIGS. 7 and 8 show calculated critical thicknesses for formation of misfit dislocation lines in strained InGaN and AlGaN films of compositions typically found in III-Nitride optoelectronics. These critical thicknesses were calculated using the methodology found in Romanov et al. (JAP 109, 103522 (2011)). For small deviations from m-plane the critical thickness for misfit formation is very large, however as the growth plane is tilted further from m-plane the critical thickness drops quickly. For example, a (60-6-1) oriented 15% InGaN film similar to what one might find in a blue-emitting LD structure has a critical thickness of ~55 nm. A film of the same composition grown on (20-2-1), miscut 10° further from the m-plane, would have a critical thickness of only ~15 nm.

Figure 9:
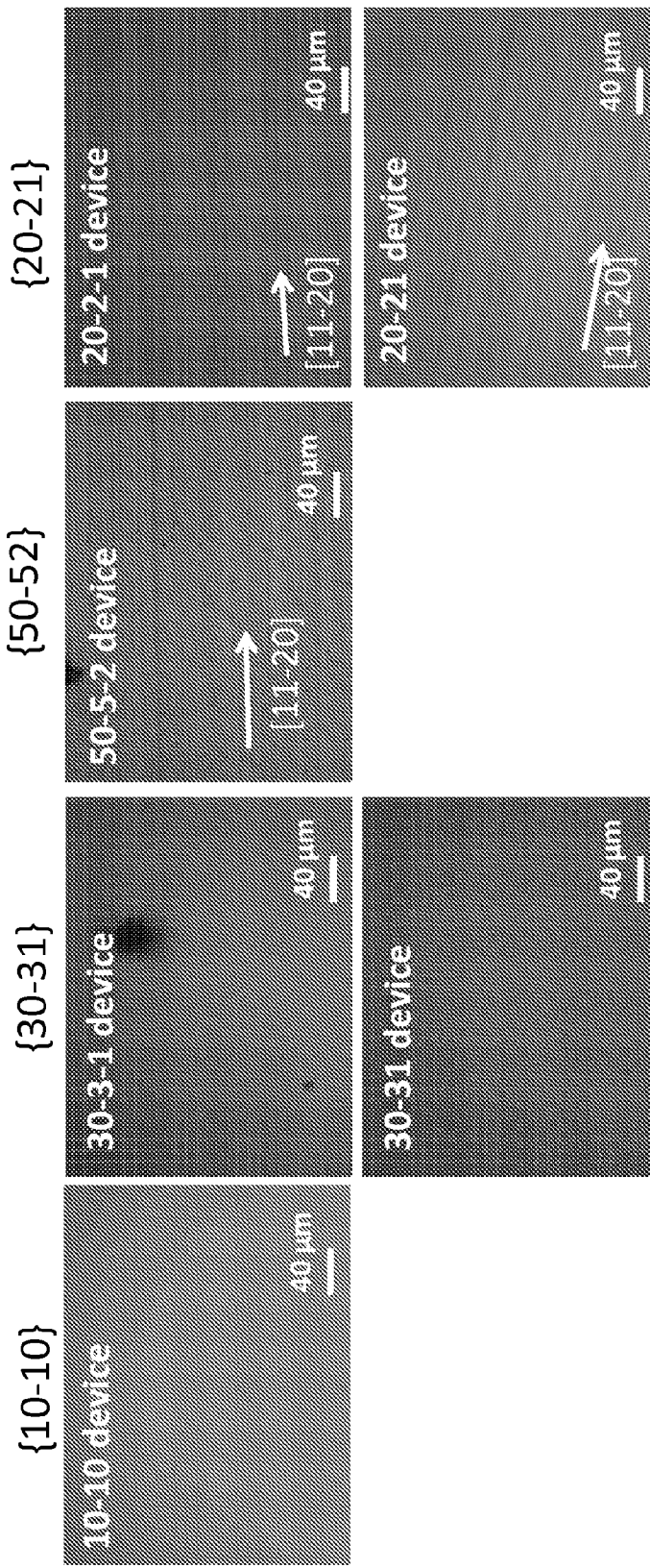
FIG. 9 shows fluorescence micrographs of blue InGaN/GaN MQW structures with well thicknesses ~50-60 Å according to embodiments of the present disclosure. The m-plane (10-10) and (30-3-1) do not show the presence of dark lines or dark spot defects throughout the general epitaxy field, while the (50-5-2), (20-2-1) and (20-21) do show such defects. It is not preferred to have such defects as they can lead to non-radiative recombination and/or reliability problems.

FIG. 9 shows microfluorescence micrographs of several blue MQW structures grown on various nonpolar and semipolar orientations with the same number of wells and well thicknesses in the range of 50-60 Å. Emission wavelengths are similar between the devices, and the microfluorescence micrographs show contrast for light emitted from the active region of the devices. Variation in contrast in these images is a result of inhomogeneity in film microstructure leading to inhomogeneous carrier density and spatial variations in the efficiency of radiative recombination. The (10-10), (30-31) and (30-3-1) oriented devices present a relatively uniform fluorescence microstructure. The (50-5-2), (20-21) and (20-2-1) oriented devices, however, show dark lines or "striations" that lie parallel to the [11-20] direction. These striations have been associated with the formation of misfit dislocations in strained layers of semi-polar oriented GaN/AlGaInN heterostructures. Misfit dislocations forming with high density in the MQW stack will result in higher non-radiative recombination rates and subsequently higher threshold current densities. Misfit dislocations in or near the LD active region also pose a serious reliability concern, as misfits near the active region have been shown in several other materials systems (most prominently Zincblende III-Vs and III-VI materials) to be a source of performance degradation. Therefore, the low density of dark lines or spots in (10-10) and (30-3-1) is a very favorable characteristic. The lower basal plane shear stresses and subsequently larger critical thickness in {30-3-1} and {30-31} films will allow for pseudomorphic growth of thicker and higher composition InGaN and AlGaN layers than are achievable on {20-21} and other crystal planes highly misoriented from m-plane. Increased resistance to misfit formation has several benefits. Thick, relatively high composition ternary layers can be used to provide the refractive index contrast needed to engineer optical modes and optimize confinement factor. Ideally, InGaN quantum wells will also be thick in order to increase overlap of carrier states with the optical modes as well as to limit Auger recombination as a non-radiative recombination mechanism. Again, since misfit dislocations forming with high density in the MQW stack will result in higher non-radiative recombination rates and subsequently higher threshold current densities, and pose serious reliability concerns, the larger critical thickness in {30-3-1} and {30-31} films compared to {20-21} and {20-2-1} is a very favorable characteristic.

In an example, a gallium and nitrogen containing material configured on (30-3-1) may also be applicable for use in light emitting diodes (LEDs). Assuming injection efficiency of 1, the internal quantum efficiency (IQE) of an LED is given by the ratio of radiative recombination to total recombination. In the Auger recombination model, total recombination rates are given by the sum of Shockley-Reed-Hall (SRH) (e.g. trap assisted) recombination, spontaneous emission and Auger recombination, which have different dependencies on carrier density in the active region. Equation 1 describes the IQE for an LED based on the Auger model. SRH, spontaneous emission and Auger recombination rates are derived from their respective coefficients A, B and C; n is the carrier density in the light emitting material.

$$IQE = \frac{Bn^2}{An + Bn^2 + Cn^3} \quad \text{Eqn. 1}$$

At low carrier densities recombination is typically dominated by SRH recombination. At high carrier densities, recombination is typically dominated by Auger recombination. In order to maximize radiative efficiency (i.e. IQE) of a device both the SRH recombination must be reduced as well as the contribution to non-radiative recombination from Auger processes. FWHM of luminescence spectra for perfect materials should be dependent, ultimately on the band structure of the material and temperature. All other things being equal, InGaN films of the same composition and thickness grown on different orientations of GaN should have similar FWHM for their PL and EL emission spectra. The large variance in FWHM implies a presence of a mechanism for broadening of the FWHM, which will typically be due to inhomogeneity in strain, composition or defectivity. A narrower FWHM, for fixed InGaN composition, therefore implies a film of higher material quality which will exhibit reduced non-radiative recombination.

Auger recombination is, unfortunately, a result of the band structure of a material, and therefore for a light emitting layer of a single material the only route to reducing Auger recombination is to lower the carrier density at the current density of interest. In a quantum well based LED this can be achieved by increasing the widths of the quantum wells.

Figure 10:
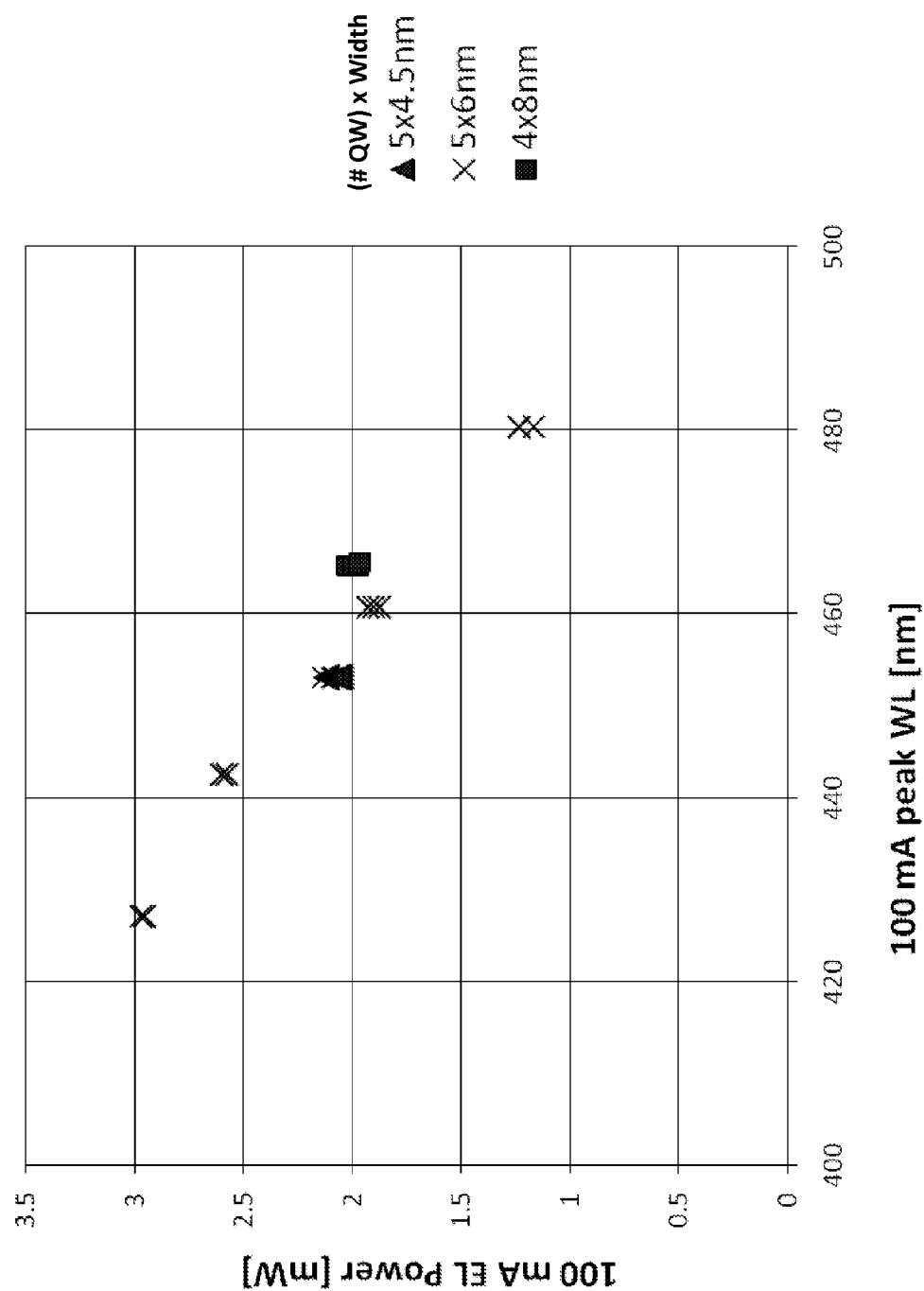
FIG. 10 shows exemplary values of electroluminescence power for (30-3-1) oriented MQW LDs according to embodiments of the present disclosure.

FIG. 10 shows blue (30-3-1) oriented InGaN/GaN LDs with varying well thickness. The 8 nm well device shows an increase in brightness at 100 mA drive current relative to the 6 nm well baseline devices, implying the material quality does not drop significantly with the increased strain of thicker wells. Both 6 nm and 8 nm are relatively thick for InGaN quantum wells emitting in the 450-460 nm wavelength range. The lack of significant degradation in performance with well thickness along with the improvement in material quality over m-plane implied by the narrower FWHM and the reduced tendency to form misfits in strained layers relative to semi-polar planes inclined further from the m-plane (e.g. (20-2-1)) suggest that (30-3-1) may also be an ideal plane for the growth of blue LEDs.

Table 3 summarizes our understanding of the advantages and disadvantages related to (10-10) oriented blue LD devices and blue LDs grown on the low-index semipolar planes derived from the (10-10) plane. While substrates with relatively low misorientations from (10-10) (e.g. <7° miscut parallel to [0001]) have excellent resistant to degradation of InGaN layers during p-cladding growth and excellent resistance to the formation of misfits in highly strained layers, they exhibit very broad luminescence spectra that will limit the performance of LDs fabricated on these orientations. Semi-polar oriented substrates with relatively large misorientations away from m-plane (e.g. (20-21) and (20-2-1)) show very good FWHM in electroluminescence, however both of these orientations exhibit reduced resistance to InGaN degradation with p-cladding growth and reduced resistance to misfit formation in strained layers. Semipolar oriented substrates with relatively small misorientations away from the m-plane (e.g. {60-61} or {40-41}) show no decrease in FWHM of spontaneous emission relative to m-plane. Intermediate misorientations such as those that deviate only a few degrees from the (30-31) and (30-3-1) planes, however, show an optimal combination of properties; narrow FWHM, relatively strong polarization ratio relative to other planes discussed in this work based on observation during electroluminescence test and resistance to degradation during p-cladding layer growth and misfit formation. Because of this unique combination of properties, we have identified substrate orientations lying within a few degrees misorientation from (30-31), or (30-3-1) and crystallographically equivalent planes as the optimal substrate orientations for growth of InGaN/GaN blue LDs.

than hetero-epitaxy growth. The nitride crystal or wafer may comprise $Al_xIn_yGa_{1-x-y}N$, where $0 \leq x, y, x+y \leq 1$. In an embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is below about $10^5$ cm$^{-2}$ or others such as those ranging from about $10^5$-$10^8$ cm$^{-2}$. Of course, there can be other variations, modifications, and alternatives In an embodiment, the device has a laser stripe region formed overlying a portion of the semipolar crystalline orientation surface region. In an embodiment, the laser stripe region is characterized by a cavity orientation is substantially parallel to the projection of the c-direction. In an embodiment, the laser stripe region has a first end and a second end.

In an embodiment, the device has a first facet provided on the first end of the laser stripe region and a second facet provided on the second end of the laser stripe region. In one or more embodiments, the first facet is substantially parallel with the second facet. Mirror surfaces are formed on each of the surfaces. The first facet comprises a first mirror surface. In an embodiment, the first mirror surface is provided by a scribing and breaking process or alternatively by etching techniques using etching technologies such as reactive ion etching (RIE), inductively coupled plasma etching (ICP), or chemical assisted ion beam etching (CAIBE), or other method. The scribing process can use any suitable techniques, such as a diamond scribe or laser scribe or combinations. In an

TABLE 3

Table summarizing key characteristics for laser diode growth and the relative performance of various non-polar and semi-polar planes with blue MQW active layers with respect to these properties. Although many planes show favorable performance for certain key characteristics, the (30-3-1) plane shows excellent performance in all categories.

| Orientation | LD structure EL Power relative to m-plane @ 455 nm | Retention of EQE with increase in well thickness | FWHM relative to m-plane @ 455 nm | Resistance to degradation during thick pGaN growth | Resistance to degradation during hot pGaN growth | Apparent strength of polarization ratio | $h_c$ for misfit formation in blue LDs (~18% InGaN) [nm] |
|---|---|---|---|---|---|---|---|
| 10-10  | 1    | Excellent | 1    | Excellent | Excellent | Good      | NA  |
| 60-6-1 | 1    | Excellent | 1    | Excellent | Excellent | Good      | ~45 |
| 40-4-1 | 1    | Excellent | 1    | Excellent | Excellent | Good      | ~30 |
| 30-3-1 | 1.84 | Excellent | 0.71 | Excellent | Excellent | Excellent | ~20 |
| 30-31  | 1.3  | Excellent | 0.71 | Excellent | Excellent | Excellent | ~20 |
| 50-5-2 | 1.6  | Good      | 0.66 | Excellent | Excellent | Excellent | ~16 |
| 20-2-1 | 1    | Poor      | 0.66 | Poor      | Poor      | Excellent | ~12 |
| 20-21  | 1    | Good      | 0.66 | Good      | Good      | Good      | ~12 |

Figure 11:
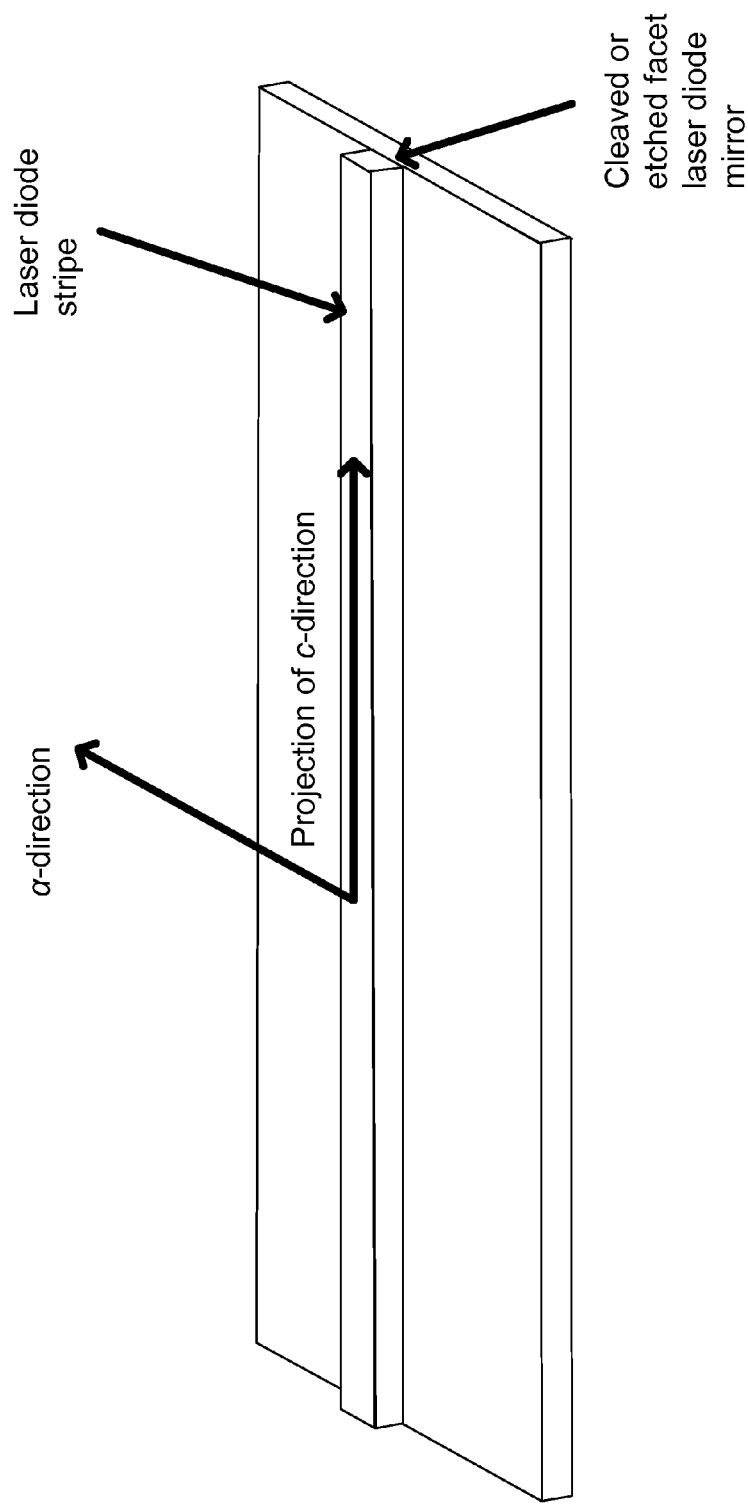
FIG. 11 is a simplified schematic diagram illustrating a laser diode structure with ridge waveguide architecture according to embodiments of the present disclosure.

FIG. 11: Example of projection of c-direction oriented laser diode stripe on semipolar (30-3-1) substrate with cleaved or etched mirrors. This diagram is merely an example, which should not unduly limit the scope of the claims herein. One of ordinary skill in the art would recognize other variations, modifications, and alternatives. As shown, the optical device includes a gallium and nitrogen containing substrate member having a semipolar crystalline surface region characterized by an orientation of about 9 degrees to about 12.5 degrees toward (000-1) from the m-plane.). In an embodiment, the gallium and nitrogen containing substrate member is a bulk GaN substrate characterized by having a semipolar crystalline surface region, but can be others. In an embodiment, the bulk GaN substrate has a surface dislocation density below $10^5$ cm$^{-2}$ or $10^5$ to $10^7$ cm$^{-2}$. It should be noted that homoepitaxial growth on bulk GaN is generally better embodiment, the first mirror surface comprises a reflective coating. In an embodiment, deposition of the reflective coating occurs using, for example, e-beam evaporation, thermal evaporation, RF sputtering, DC sputtering, ECR sputtering, ion beam deposition, Ion Assisted Deposition, reactive ion plating, any combinations, and the like. In still other embodiments, the present method may provide surface passivation to the exposed surface prior to coating. The reflective coating is selected from silicon dioxide, hafnia, and titania, tantalum pentoxide, zirconia, including combinations, and the like. Preferably, the reflective coating is highly reflective and includes a coating of silicon dioxide and tantalum pentoxide, which has been deposited using electron beam deposition. Depending upon the embodiment, the first mirror surface can also comprise an anti-reflective coating. Additionally, the facets can be cleaved or etched or a combination of them. Of course, there can be other variations, modifications, and alternatives.

Also in an embodiment, the second facet comprises a second mirror surface. The second mirror surface is provided by a scribing and breaking process according to an embodiment or alternatively by etching techniques using etching technologies such as reactive ion etching (RIE), inductively coupled plasma etching (ICP), or chemical assisted ion beam etching (CAIBE), or other method. Preferably, the scribing is diamond scribed or laser scribed or the like. In an embodiment, the second mirror surface comprises a reflective coating, such as silicon dioxide, hafnia, titania, tantalum pentoxide, zirconia, combinations, and the like. In an embodiment, the second mirror surface comprises an anti-reflective coating, such alumina or aluminum oxide. In an embodiment, the coating can be formed using electron beam deposition, thermal evaporation, RF sputtering, DC sputtering, ECR sputtering, ion beam deposition, ion assisted deposition, reactive ion plating, any combinations, and the like. In still other embodiments, the present method may provide surface passivation to the exposed surface prior to coating. Of course, there can be other variations, modifications, and alternatives.

In an embodiment, the laser stripe has a length and width. The length ranges from about 100 microns to about 3,000 microns. The stripe also has a width ranging from about 0.5 microns to about 50 microns, but can be other dimensions. In an embodiment, the stripe can also be about 6 to 25 microns wide for a high power multi-lateral-mode device or 1 to 2 microns for a single lateral mode laser device. In an embodiment, the width is substantially constant in dimension, although there may be slight variations. The width and length are often formed using a masking and etching process, which are commonly used in the art. Further details of the present device can be found throughout the present specification and more particularly below.

In an embodiment, the device is also characterized by a spontaneously emitted light that is polarized in substantially perpendicular to the projection of the c-direction (in the a-direction). That is, the device performs as a laser or the like. In an embodiment, the spontaneously emitted light is characterized by a polarization ratio of greater than 0.2 to about 1 perpendicular to the c-direction. In an embodiment, the spontaneously emitted light characterized by a wavelength ranging from about 400 nanometers to yield a violet emission, a blue emission, a green emission, and others. In one or more embodiments, the light can be emissions ranging from violet 395 nm to 420 nanometers; blue 430 nm to 470 nm; green 500 nm to 540 nm; and others, which may slightly vary depending upon the application. In an embodiment, the spontaneously emitted light is highly polarized and is characterized by a polarization ratio of greater than 0.4. In an embodiment, the emitted light is characterized by a polarization ratio that is preferred. Of course, there can be other variations, modifications, and alternatives. Further details of the laser device can be found throughout the present specification and more particularly below.

Figure 12:
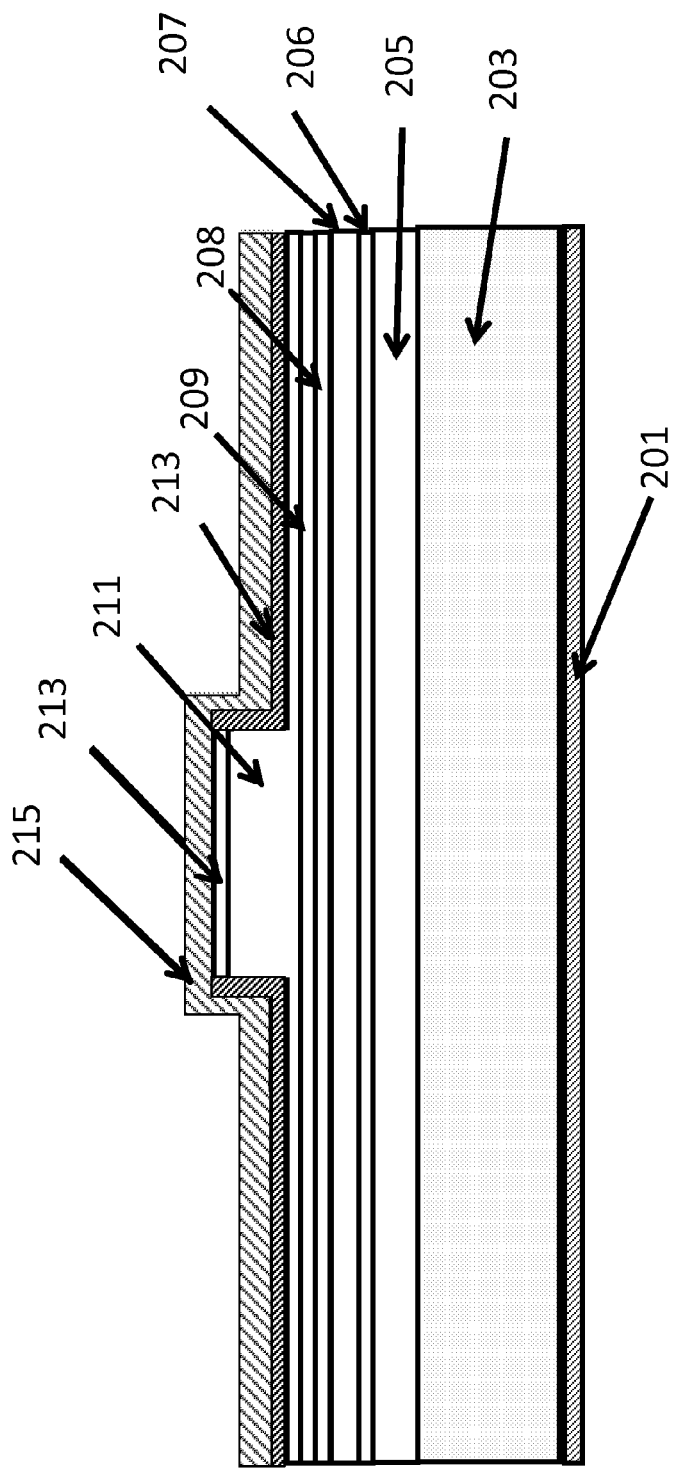
FIG. 12 is a simplified schematic cross-sectional diagram illustrating a laser diode structure according to embodiments of the present disclosure.

FIG. 12 is a simplified schematic cross-sectional diagram illustrating a laser diode structure according to embodiments of the present disclosure. This diagram is merely an example, which should not unduly limit the scope of the claims herein. One of ordinary skill in the art would recognize other variations, modifications, and alternatives. As shown, the laser device includes gallium and nitrogen containing substrate 203, which has an underlying n-type metal back contact region 201. In an embodiment, the metal back contact region is made of a suitable material such as those noted below and others. Further details of the contact region can be found throughout the present specification and more particularly below.

In an embodiment, the device also has an overlying n-type gallium and nitrogen containing layer 205, an active region 207, and an overlying p-type gallium and nitrogen containing layer structured as a laser stripe region 211. Additionally, the device also includes an n-side separate confinement heterostructure (SCH) 206, p-side guiding layer or SCH 208, p-AlGaN EBL 209, among other features. In an embodiment, the device also has a p++ type gallium and nitrogen containing material 213 to form a contact region. In an embodiment, the p++ type contact region has a suitable thickness and may range from about 10 nm 50 nm, or other thicknesses. In an embodiment, the doping level can be higher than the p-type cladding region and/or bulk region. In an embodiment, the p++ type region has doping concentration ranging from about $10^{19}$ to $10^{21}$ Mg/cm$^3$, and others. The p++ type region preferably causes tunneling between the semiconductor region and overlying metal contact region. In an embodiment, each of these regions is formed using at least an epitaxial deposition technique of metal organic chemical vapor deposition (MOCVD), molecular beam epitaxy (MBE), or other epitaxial growth techniques suitable for GaN growth. In an embodiment, the epitaxial layer is a high quality epitaxial layer overlying the n-type gallium and nitrogen containing layer. In some embodiments the high quality layer is doped, for example, with Si or O to form n-type material, with a dopant concentration between about $10^{16}$ cm$^{-3}$ and $10^{20}$ cm$^{-3}$. In an alternative embodiment the device does not include an Al-containing EBL layer.

In an embodiment, an n-type Al$_u$In$_v$Ga$_{1-u-v}$N layer, where $0 \le u$, $v$, $u+v \le 1$, is deposited on the substrate. In an embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE). Of course, there can be other variations, modifications, and alternatives.

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 900 to about 1200 degrees Celsius in the presence of a nitrogen-containing gas. As an example, the carrier can be hydrogen or nitrogen or others. In an embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (e.g., ammonia) to the flow rate of the group III precursor (trimethylgallium, triethylgallium, trimethylindium, trimethylaluminum) during growth is between about 2,000 and about 12,000. A flow of disilane in a carrier gas, with a total flow rate of between about 0.1 and 10 sccm is initiated.

In an embodiment, the laser stripe region is made of the p-type gallium and nitrogen containing layer 211. In an embodiment, the laser stripe is provided by an etching process selected from dry etching or wet etching. In an embodiment, the etching process is dry, but can be others. As an example, the dry etching process is an inductively coupled plasma process using chlorine bearing species or a reactive ion etching process using similar chemistries or combination of ICP and RIE, among other techniques. Again as an example, the chlorine bearing species are commonly derived from chlorine gas or the like. The device also has an overlying dielectric region, which exposes 213 contact region, which is preferably a p++ gallium and nitrogen containing region. In an embodiment, the dielectric region is an oxide such as silicon dioxide or silicon nitride, but can be others, such as those described in more detail throughout the present specification and more particularly below. The contact region is coupled to an overlying metal layer 215. The overlying metal layer is a multilayered structure containing gold and nickel (Ni/Au), but can be others such as gold and palladium (Pd/Au) or gold and platinum (Pt/Au). In an alternative embodiment, the metal layer comprises Ni/Au formed using suitable techniques. In an embodiment, the Ni/Au is formed via electron-beam deposition, sputtering, or any like techniques. The thickness includes nickel material ranging in thickness from about 50 to about 100 nm and gold material ranging in thickness from about 100 Angstroms to about 1-3 microns, and others. Of course, there can be other variations, modifications, and alternatives In an embodiment, the dielectric region can be made using a suitable technique. As an example, the technique may include reactively sputter of $SiO_2$ using an undoped polysilicon target (99.999% purity) with $O_2$ and Ar. In an embodiment, the technique uses RF magnetron sputter cathodes configured for static deposition; sputter target; throw distance; pressure: 1-5 mT or about 2.5 mT, power: 300 to 400 W; flows: 2-3.-9 sccm $O_2$, 20-50 sccm, Ar, deposition thickness: 1000-2500 A, and may include other variations. In an embodiment, deposition may occur using non-absorbing, nonconductive films, e.g., SiN, $Al_2O_3$, $Ta_2O_5$, $SiO_2$, $Ta_2O_5$, $ZrO_2$, $TiO_2$, $HfO_2$, $NbO_2$. Depending upon the embodiment, the dielectric region may be thinner, thicker, or the like. In other embodiments, the dielectric region can also include multilayer coatings, e.g., 1000 A of $SiO_2$ capped with 500 A of $Al_2O_3$. Deposition techniques can include, among others, ebeam evaporation, thermal evaporation, RF Sputter, DC Sputter, ECR Sputter, Ion Beam Deposition, Ion Assisted Deposition, reactive ion plating, combinations, and the like. Of course, there can be other variations, modifications, and alternatives.

In an embodiment, the laser device has active region 207. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 1-20 quantum wells. Preferably, the active layer may include about 3-7 quantum wells or more preferably 4-6 quantum wells or others. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \le w, x, y, z, w+x, y+z \le 1$, where w<u, y and/or x>v, z so that the bandgap of the well layer(s) is less than that of the barrier layer(s) and the n-type layer. The well layers and barrier layers may each have a thickness between about 1 nm and about 40 nm. In an embodiment, each of the thicknesses is preferably 3-8 nm. In an embodiment, each well region may have a thickness of about 5 nm to 7 nm and each barrier region may have a thickness of about 2 nm to about 5 nm, among others. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type. Of course, there can be other variations, modifications, and alternatives.

In an embodiment, the active region can also include an electron blocking region, and a separate confinement heterostructure. In an embodiment, the separate confinement heterostructure (SCH) can include AlInGaN or preferably InGaN, but can be other materials. The SCH is generally comprised of material with an intermediate index between the cladding layers and the active layers to improve confinement of the optical mode within the active region of the laser device according to an embodiment. In one or more embodiments, the SCH layers have a preferred thickness, impurity, and configuration above and below the active region to confine the optical mode. Depending upon the embodiment, the upper and lower SCH can be configured differently or the same. The electron blocking region can be on either side or both sides of the SCH positioned above the active region according to an embodiment. In an embodiment, the SCH can range from about 10 nm to about 150 nm, and preferably about 40 to 100 nm for the lower SCH region. In the upper SCH region, the thickness ranges from about 20 to 50 nm in an embodiment. As noted, the SCH is preferably InGaN having about 2% to about 5% InN or 5% to about 10% InN by molar percent according to an embodiment. Of course, there can be other variations, modifications, and alternatives.

In some embodiments, an electron blocking layer is preferably deposited. In an embodiment, the electron blocking layer comprises a gallium and nitrogen containing material including magnesium $10^{16}$ $cm^{-3}$ to about $10^{22}$ $cm^{-3}$. The electron-blocking layer may comprise $Al_sIn_tGa_{1-s-t}N$, where $0 \le s, t, s+t \le 1$, with a higher bandgap than the active layer, and may be doped p-type. In one specific embodiment, the electron blocking layer comprises AlGaN with an Al composition ranging from 5 to 20%. In another embodiment, the electron blocking layer may not contain Al. In another embodiment, the electron blocking layer comprises an AlGaN/GaN superlattice structure, comprising alternating layers of AlGaN and GaN, each with a thickness between about 0.2 nm and about 5 nm. In another embodiment the device may not contain an electron blocking layer. Of course, there can be other variations, modifications, and alternatives.

As noted, the p-type gallium and nitrogen containing structure, which can be a p-type doped $Al_qIn_rGa_{1-q-r}N$, where $0 \le q, r, q+r \le 1$, layer is deposited above the active layer. The p-type layer may be doped with Mg, to a level between about $10^{16}$ $cm^{-3}$ and $10^{22}$ $cm^{-3}$, and may have a thickness between about 5 nm and about 1000 nm. The outermost 1-50 nm of the p-type layer may be doped more heavily than the rest of the layer, so as to enable an improved electrical contact. In an embodiment, the laser stripe is provided by an etching process selected from dry etching or wet etching. In an embodiment, the etching process is dry, but can be others. The device also has an overlying dielectric region, which exposes 213 contact region. In an embodiment, the dielectric region is an oxide such as silicon dioxide, but can be others. Of course, there can be other variations, modifications, and alternatives.

In an embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In an embodiment, the electrical contact serves as a p-type electrode for the optical device. In another embodiment, the electrical contact serves as an n-type electrode for the optical device. Of course, there can be other variations, modifications, and alternatives.

In an embodiment, a ridge waveguide is fabricated using a certain deposition, masking, and etching processes. In an embodiment, the mask is comprised of photoresist (PR) or dielectric or any combination of both and/or different types of them. The ridge mask is 1 microns to 2.5 microns wide for single lateral mode applications or 2.5 µm to 30 µm wide for multimode applications. The ridge waveguide is etched by ion-coupled plasma (ICP), reactive ion etching (RIE), chemical assisted ion beam (CAIBE) etched, or other method. The etched surface is 20 nm to 250 nm above the active region. A dielectric passivation layer is then blanket deposited by any number of commonly used methods in the art, such as sputter, e-beam, PECVD, or other methods. This passivation layer can include $SiO_2$, $Si_3N_4$, $Ta_2O_5$, or others. The thickness of this layer is 80 nm to 400 nm thick. An ultrasonic process is used to remove the etch mask which is covered with the dielectric. This exposes the p-GaN contact layer. P-contact metal is deposited by e-beam, sputter, or other deposition technique using a PR mask to define the 2D geometry. The contact layer can be Ni/Au but others can be Pt/Au or Pd/Au. Further details of the present method and resulting structure can be found throughout the present specification and more particularly below. Further details of the facets can be found throughout the present specification and more particularly below.

In one or more preferred embodiments, the present disclosure provides a laser structure without an aluminum bearing cladding region. In an embodiment, the laser device comprises a multi-quantum well active region having thin barrier layers. In one or more embodiments, the active region comprises three or more quantum well structures. Between each of the quantum well structures comprises a thin barrier layer, e.g., 7 nm and less, 6 nm and less, 5 nm and less, 4 nm and less, 3 nm and less, 2 nm and less. In an embodiment, the combination of thin barrier layers configured in the multi-quantum well structures enables a low voltage (e.g., 6 volts and less) laser diode free from use of aluminum bearing cladding regions.

In an embodiment, the present disclosure provides an optical device. The optical device has a gallium and nitrogen containing substrate including a {30-31} or {30-3-1} crystalline surface region orientation, which may be off-cut. The device preferably has an n-type cladding material overlying the n-type gallium and nitrogen containing material according to an embodiment. The n-type cladding material is substantially free from an aluminum bearing material according to an embodiment. In certain embodiments, substantially free from Al-bearing species means that a region, such as a p-cladding region or an n-cladding region is characterized by a AlN mol fraction of less than about 3%, less than about 2%, and in certain embodiments, less than about 1%. The device also has an active region comprising at least three quantum wells. Each of the quantum wells has a thickness of 3.0 nm and greater or 5.5 nm and greater, and one or more barrier layers. Each of the barrier layers has a thickness ranging from about 2 nm to about 4 nm or about 4 nm to about 8 nm and is configured between a pair of quantum wells according to an embodiment. At least one or each of the barrier layers has a thickness ranging from about 2 nm to about 4 nm and is configured between a pair of quantum wells or adjacent to a quantum well according to an embodiment. At least one or each of the barrier layers has a thickness ranging from about 4 nm to about 6.5 nm and is configured between a pair of quantum wells or adjacent to a quantum well according to an embodiment. Preferably, the device has a p-type cladding material overlying the active region. Preferably, the p-type cladding material is substantially free from an aluminum bearing material according to an embodiment. In an embodiment, the active region is configured for a forward voltage of less than about 6V or less than about 5V for the device for an output power of 60 mW or 100 mW and greater. Of course, there can be other variations, modifications, and alternatives.

In yet an alternative embodiment, the present disclosure provides an optical device. The device has a gallium and nitrogen containing substrate including a {30-31} or {30-3-1} crystalline surface region orientation. The device also has an n-type cladding material overlying the n-type gallium and nitrogen containing material. The n-type cladding material is substantially free from an aluminum bearing material. The device further has an active region comprising at least three quantum wells. Each of the quantum wells has a thickness of 3.5 nm and greater or 5 nm and greater and one or more barrier layers according to an embodiment. Each of the barrier layers has a thickness ranging from about 2 nm to about 4 nm or about 4 nm to about 8 nm according to an embodiment. Each of the barrier layers is configured between a pair of quantum wells according to one or more embodiments. At least one or each of the barrier layers has a thickness ranging from about 2 nm to about 5 nm and is configured between a pair of quantum wells or adjacent to a quantum well according to an embodiment. At least one or each of the barrier layers has a thickness ranging from about 4 nm to about 8 nm and is configured between a pair of quantum wells or adjacent to a quantum well according to an embodiment. The device also has a p-type cladding material overlying the active region. The p-type cladding material is substantially free from an aluminum bearing material according to an embodiment. The device optionally has a p-type material overlying the p-type cladding material.

In other embodiments, the invention provides yet an alternative optical device, which has a gallium and nitrogen containing substrate including a {30-31} or {30-3-1} crystalline surface region orientation. An n-type cladding material is overlying the n-type gallium and nitrogen containing material. Preferably, the n-type cladding material is substantially free from an aluminum bearing material. The device has an active region comprising at least three quantum wells, each of which has a thickness of 4 nm and greater. The device has one or more barrier layers, each of which has an n-type impurity characteristic and a thickness ranging from about 2 nm to about 4 nm or about 4 nm to about 8 nm in one or more alternative embodiments. Preferably, each of the barrier layers is configured between a pair of quantum wells according to an embodiment. The device also has a p-type cladding material overlying the active region according to an embodiment. The p-type cladding material is substantially free from an aluminum bearing material according to an embodiment. The device also has a p-type material overlying the p-type cladding material.

In other embodiments, the invention provides a method of fabricating an optical device, which has a gallium and nitrogen containing substrate including a {30-31} or {30-3-1} crystalline surface region orientation. An n-type cladding material is overlying the n-type gallium and nitrogen containing material. Preferably, the n-type cladding material is substantially free from an aluminum bearing material. The method includes forming an active region comprising at least three quantum wells, each of which has a thickness of 3.5 nm and greater. The device has one or more barrier layers, each of which has an n-type impurity characteristic and a thickness ranging from about 2 nm to about 4 nm or about 4 nm to about 8 nm in one or more alternative embodiments. Preferably, each of the barrier layers is configured between a pair of quantum wells according to an embodiment. The method also includes forming a p-type cladding material overlying the active region according to an embodiment. The p-type cladding material is substantially free from an aluminum bearing material according to an embodiment. The method also includes forming a p-type material overlying the p-type cladding material.

In an embodiment, the present disclosure provides an optical device, such as a laser diode. The device has a gallium and nitrogen containing substrate including a {30-31} or {30-3-1} crystalline surface region orientation, which may be off-cut according to one or more embodiments. The device has an n-type cladding material overlying the n-type gallium and nitrogen containing material. In an embodiment, the n-type cladding material is substantially free from an aluminum bearing material. The device also has an active region comprising at least three quantum wells. In an embodiment, each of the quantum wells has a thickness of 3.5 nm and greater and one or more barrier layers according to an embodiment. Each of the barrier layers has a p-type characteristic and a thickness ranging from about 2 nm to about 3.5 nm in an embodiment. Each of the barrier layers has a p-type characteristic and a thickness ranging from about 3.5 nm to about 7 nm in an alternative specific embodiment. In an embodiment, each of the barrier layers is configured between a pair of quantum wells. The device also has a p-type cladding material overlying the active region. Preferably, the p-type cladding material is substantially free from an aluminum bearing material. And overlying p-type material is included. In an embodiment, the active region is configured for a forward voltage of less than about 6V or less than about 7V for the device for an output power of 60 mW and greater. In other embodiments for non-polar m-plane devices or semipolar (30-3-1) or (30-31) planes, operable in the blue (430 nm to 475 nm) and green (505 nm to 530 nm), the present method and structure include five (5) or more thick QWs of greater than 4 or 5 nm in thickness and thin barriers that are 2 nm to 4 nm in thickness.

In one or more embodiments, the present disclosure includes a laser diode substantially free from an aluminum containing cladding region. To form the laser diode without an aluminum containing cladding region, the present laser diode includes three or more quantum wells to provide enough confinement of the optical mode for sufficient gain to reach lasing. However, when the number of quantum wells increases in the active region, the forward voltage of the diode can increase, as a tradeoff. We have determined that the forward voltage of the diode can be reduced in multi-quantum well active regions by way of the use of thin barriers on the order of 3 nm to 4 nm, which are much thinner than conventional lasers such as those in Yoshizumi et al., "Continuous-Wave operation of 520 nm Green InGaN-Based Laser Diodes on Semi-Polar {20-21} GaN Substrates," Applied Physics Express 2 (2009) 092101. We have also determined that the forward voltage can be reduced in multi-quantum well active regions by adding p or n-type dopant species to the active region according to one or more other embodiments. Although any one or combination of these approached can be used, we believe it would be preferable to use the thin barrier approach to avoid adding impurities to the active region. The impurities may change optical losses and alter the electrical junction placement according to one or more embodiments. Accordingly, the present disclosure provides a laser device and method that is free from aluminum-containing cladding regions with low voltage on {30-31} or {30-3-1} substrates. Of course, there can be other variations, modifications, and alternatives.

Moreover, the present disclosure provides an optical device that is substantially free from aluminum bearing cladding materials. The device has a gallium and nitrogen containing substrate member having a {30-31} or {30-3-1} crystalline surface region. The device has an n-type gallium and nitrogen containing cladding material. In an embodiment, the n-type gallium and nitrogen containing cladding material is substantially free from an aluminum species, which leads to imperfections, defects, and other limitations. The device also has an active region including multiple quantum well structures overlying the n-type gallium and nitrogen containing cladding material. In one or more preferred embodiments, the device also has thin barrier layers configured with the multiple well structures. The device has a p-type gallium and nitrogen containing cladding material overlying the active region. In an embodiment, the p-type gallium and nitrogen containing cladding material is substantially free from an aluminum species. The device preferably includes a laser stripe region configured from at least the active region and characterized by a cavity orientation substantially parallel to a projection in a c-direction. The laser strip region has a first end and a second end. The device also has a first cleaved or etched facet provided on the first end of the laser stripe region and a second cleaved or etched facet provided on the second end of the laser stripe region. Depending upon the embodiment, the facets may be cleaved, etched, or a combination of cleaved and etched. In yet other embodiments, the present device includes a gallium and nitrogen containing electron blocking region that is substantially free from aluminum species. In yet other embodiments, the device does not include any electron blocking layer or yet in other embodiments, there is no aluminum in the cladding layers and/or electron blocking layer, although other embodiments include aluminum containing blocking layers. In still other embodiments, the optical device and method are free from any aluminum material, which leads to defects, imperfections, and the like. Further details of these limitations can be found throughout the present specification and more particularly below.

In preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates," Applied Physics Express 2 (2009) 092101. That is, the present laser structure and method are substantially free from any aluminum species in the cladding region. Aluminum is generally detrimental. Aluminum often leads to introduction of oxygen in the reactor, which can act as non radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum cladding layers is also cumbersome and can take additional time to grow. Accordingly, it is believed that the aluminum cladding free laser method and structure are generally more efficient to grow than conventional laser structures. Further benefits are described throughout the present specification and more particularly below.

Figure 13:
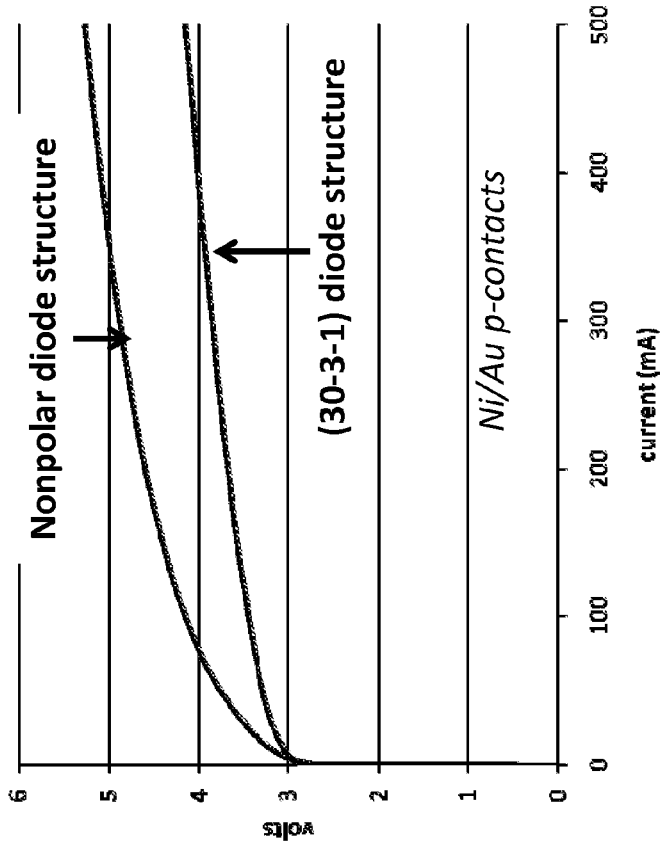
FIG. 13 illustrates voltage versus current (IV) characteristics in diode test structures on m-plane and (30-3-1) using the same p-contact and n-contact schemes and the same epitaxial structure according to embodiments of the present disclosure. As can be seen in the figure, (30-3-1) offers lower diode ideality factor and lower p-contact resistance for the identical structure.

FIG. 13. Example of voltage characteristics of the optical devices according to embodiments of the present disclosure.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above toward an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above toward an (h k l) plane wherein l=0, and at least one of h and k is non-zero).

As shown, the present device can be enclosed in a suitable package. Such package can include those such as in TO-38 and TO-56 headers. Other suitable package designs and methods can also exist, such as TO-9 or flat packs where fiber optic coupling is needed and even non-standard packaging. In an embodiment, the present device can be implemented in a co-packaging configuration such as those described in U.S. Provisional Application No. 61/347,800, commonly assigned, and hereby incorporated by reference for all purposes.

In other embodiments, the present laser device can be configured in a variety of applications. Such applications include laser displays, metrology, communications, health care and surgery, information technology, and others. As an example, the present laser device can be provided in a laser display such as those described in U.S. application Ser. No. 12/789,303 filed on May 27, 2010, which claims priority to U.S. Provisional Application Nos. 61/182,105 filed on May 29, 2009, and 61/182,106 filed on May 29, 2009, each of which is hereby incorporated by reference herein.

In certain embodiments, an optical device comprises: a gallium and nitrogen containing substrate member having a semipolar crystalline surface region characterized by a {30-3-1} surface orientation or an offcut of the {30-3-1} plane; a laser stripe region formed overlying a portion of the semipolar crystalline surface region, the laser stripe region being characterized by a cavity orientation substantially parallel to the projection of the c-direction, the laser stripe region having a first end and a second end; a first facet provided on the first end of the laser stripe region; a second facet provided on the second end of the laser stripe region; an n-type cladding region overlying the semipolar crystalline surface region; an active region comprising at least one active layer overlying the n-type cladding region; the at least one active layer comprising a quantum well region or a double hetero-structure region; and a p-type cladding region overlying the active region; wherein the active layer region is configured to emit electromagnetic radiation characterized by a wavelength ranging from about 430 nm to about 475 nm.

In certain embodiments of an optical device, the surface orientation is inclined from (30-3-1) within +2 degrees to −3 degrees about the in-plane [11-20] direction toward an m-plane, wherein the m-plane is a (10-10) plane, the +2 and −3 degrees corresponding, to an inclination of approximately 8 degrees and 13 degrees, respectively, from the m-plane about the in-plane [11-20] direction; and wherein the surface configuration is inclined from (30-3-1) within +10 degrees to −10 degrees about the in-plane projection of the [0001] direction.

In certain embodiments of an optical device, a total thickness of the at least one active layer is greater than 15 nm, greater than 25 nm, or greater than 35 nm.

In certain embodiments of an optical device, a total thickness of the active layer region is greater than 15 nm; and wherein the active region comprises at least three quantum well regions.

In certain embodiments of an optical device, a total thickness of the at least one active layer is greater than 20 nm or greater than 25 nm; and the active region comprises at least five quantum wells.

In certain embodiments of an optical device, each of the quantum well regions comprises a plurality of barrier layers separating a plurality of active layers, each of the barrier layers having a thickness from 2 nm to 4 nm or from 4 nm and 8 nm.

In certain embodiments of an optical device, the p-type cladding region is substantially free from aluminum.

In certain embodiments of an optical device, the n-type cladding region is substantially free from aluminum.

In certain embodiments of an optical device, the optical device comprises a p-cladding region configured overlying the active region, the p-cladding region deposited at a growth temperature of greater than 100 degrees Celsius or greater than 150 degrees Celsius higher than the growth temperature of the active layers in the active region.

In certain embodiments of an optical device, a total thickness of the active region is greater than 25 nm; the active region comprises active layers comprising an InN mole fraction of between 0.15% and 0.25%; and the active region layers comprise an average linear density of misfit dislocations measured in the in-plane direction perpendicular to the in-plane [11-20] of less than $1\times10^5$ cm$^{-1}$.

In certain embodiments of an optical device, a total thickness of the active region is greater than 40 nm; the active region comprises layers comprising an InN mole fraction of between 0.05% and 0.20%; and the active region layers comprises an average linear density of misfit dislocations measured in the in-plane direction perpendicular to the in-plane [11-20] of less than $1\times10^5$ cm$^{-1}$.

In certain embodiments of an optical device, the first facet is substantially parallel to the second facet; and the first facet comprises a first mirror surface characterized by a scribed and broken region or by an etched region.

In certain embodiments of an optical device, a cavity length of the laser stripe region ranges from about 100 microns to about 2,000 microns; and a cavity width of the laser stripe region ranges from about 1 micron to about 25 microns.

In certain embodiments of an optical device, a separate confinement hetero-structure overlies the n-type cladding region and underlies the active region; and the separate confinement hetero-structure comprises InGaN with an InN mol fraction ranging from 1% to 10% and a thickness ranging from 10 nm to 200 nm.

In certain embodiments, an optical device comprises: a gallium and nitrogen containing substrate member having a semipolar crystalline surface configuration characterized by {30-3-1} surface orientation or an offcut of the {30-3-1}plane; a laser stripe region formed overlying a portion of the semipolar crystalline surface region, the laser stripe region being characterized by a cavity orientation substantially parallel to the projection of the c-direction, the laser stripe region having a first end and a second end; a first facet provided on the first end of the laser stripe region; a second facet provided on the second end of the laser stripe region; an n-type cladding region overlying the semipolar crystalline surface, the n-type cladding region being substantially free of Al-bearing species; an active region comprising at least one active layer region overlying the n-type cladding region, wherein a total thickness of the at least one active layer region is greater than or equal to 10 nm, and the active region comprises a quantum well region or a double hetero-structure region; a p-type cladding region overlying the active layer region, the p-type cladding region being substantially free of Al-bearing species; wherein the at least one active layer region is configured to emit electromagnetic radiation characterized by a wavelength ranging from about 430 nm to about 475 nm.

In certain embodiments of an optical device, the surface configuration is inclined from (30-3-1) within +2 to −3 degrees about the in-plane [11-20] direction toward an m-plane, wherein the m-plane is a (10-10) plane, the +2 degrees and −3 degrees corresponding to an inclination of approximately 8 degrees and 13 degrees, respectively, from the m-plane about the in-plane [11-20] direction.

In certain embodiments of an optical device, the optical device comprises a p-cladding region configured overlying the active region, wherein the p-cladding region is deposited at a growth temperature of greater than 100 degrees Celsius or greater than 150 degrees Celsius higher than the growth temperature of the at least one active layer region of the active region.

In certain embodiments of an optical device, a total thickness of the active region is greater than 15 nm or 25 nm; and the active region comprises at least three or at least five quantum wells.

In certain embodiments of an optical device, the first facet is substantially parallel with the second facet; and the first facet comprises a first mirror surface characterized by a scribed and broken region or by an etched region.

In certain embodiments, an optical device comprises: a gallium and nitrogen containing substrate member having a semipolar crystalline surface region characterized by a {30-3-1} orientation or offcut of the {30-3-1} plane; a laser stripe region formed overlying a portion of the semipolar crystalline surface region, the laser stripe region being characterized by a cavity orientation substantially parallel to the projection of the c-direction, the laser stripe region having a first end and a second end; a first facet provided on the first end of the laser stripe region; a second facet provided on the second end of the laser stripe region; an n-type cladding region overlying the semipolar crystalline surface region, the n-type cladding region being substantially free of Al-bearing species; an active region comprising at least one active layer region overlying the n-type cladding region, wherein a total thickness of the at least one active layer region is greater than or equal to 20 nm; and a p-type cladding region overlying the at least one active layer region, the p-type cladding region being substantially free of Al-bearing species; wherein the at least one active layer region is configured to emit electromagnetic radiation characterized by a wavelength ranging from about 430 nm to about 470 nm.

In certain embodiments, methods of manufacturing an optical device comprise: providing a gallium and nitrogen containing substrate member having a semipolar crystalline surface region characterized by a {30-3-1} orientation or an offcut of the {30-3-1} plane; forming an n-type cladding region over the semipolar crystalline surface region; forming an active region comprising at least one active layer region overlying the n-type cladding region at a first temperature range, the at least one active layer region being configured to emit electromagnetic radiation characterized by a wavelength ranging from about 425 nm to about 475 nm, the active region comprising a quantum well region or double heterostructure region; and forming a p-type cladding region overlying the active region using a second temperature range of at least 100 degrees greater than an upper limit of the first temperature range provided during formation of the active region.

In certain embodiments of a method, the surface configuration is inclined from (30-3-1) within +2 degrees to −3 degrees about the in-plane [11-20] direction toward an m-plane, wherein the m-plane is a (10-10) plane, the +2 degrees and −3 degrees corresponding, to an inclination of approximately 8 degrees and 13 degrees, respectively, from the m-plane about the in-plane [11-20] direction.

In certain embodiments of a method, a total thickness of the active region is greater than 15 nm or greater than 25 nm; and the active region comprises at least three quantum well regions or five quantum well regions.

In certain embodiments of a method, the first facet is substantially parallel to the second facet; and the first facet comprises a first mirror surface characterized by a laser scribed and broken region or by an etched region.

In certain embodiments of a method, the second temperature causes a growth condition to achieve a preferred crystal quality and a resistivity between a metal to semiconductor contact region and/or a resistivity of the p-type cladding region, the second temperature being maintained for at least 10 minutes or at least 20 minute.

In certain embodiments, an optical device comprises: a gallium and nitrogen containing substrate member having a semipolar crystalline surface region characterized by a {30-3-1} surface orientation or an offcut of the {30-3-1} plane; a laser stripe region formed overlying a portion of the semipolar crystalline surface region, the laser stripe region being characterized by a cavity orientation substantially parallel to the projection of the c-direction, the laser stripe region having a first end and a second end; a first facet provided on the first end of the laser stripe region; a second facet provided on the second end of the laser stripe region; an n-type cladding region overlying the semipolar crystalline surface region, the n-type cladding region being substantially free of Al-bearing species; an active region comprising at least one active layer region overlying the n-type cladding region, a total thickness of the at least one active layer region greater than or equal to 15 nm; a p-type cladding region overlying the active region, the p-type cladding region being substantially free of Al-bearing species; wherein the p-cladding region is deposited at a growth temperature of greater than 100 degrees Celsius higher than a growth temperature of the active layers in the active region; and the at least one active layer region is configured to emit electromagnetic radiation characterized by a wavelength ranging from about 430 nm to about 470 nm.

Growth structures and methods for forming laser diodes on {30-31} or off-cut gallium and nitrogen containing substrates are disclosed in U.S. Pat. No. 8,351,478, which is incorporated by reference herein.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions such as n-type GaN, combinations, and the like. Additionally, the examples illustrates two waveguide structures in normal configurations, there can be variations, e.g., other angles and polarizations. For semi-polar, the present method and structure includes a stripe oriented perpendicular to the c-axis, an in-plane polarized mode is not an Eigen-mode of the waveguide. The polarization rotates to elliptic (if the crystal angle is not exactly 45 degrees, in that special case the polarization would rotate but be linear, like in a half-wave plate). The polarization will of course not rotate toward the propagation direction, which has no interaction with the Al band. The length of the a-axis stripe determines which polarization comes out at the next mirror. Also, the term {30-3-1} can be either (30-31) or (30-3-1), among other interpretations known to one of ordinary skill in the art. Although the embodiments above have been described in terms of a laser diode, the methods and device structures can also be applied to any light emitting diode device. In an example, the gallium and nitrogen containing device configured on {30-3-1} is characterized by a first FWHM of an electroluminescence spectrum of a spontaneous emission is less than a second FWHM of an electroluminescence spectrum of a spontaneous emission for a substantially similar growth structure configured on a GaN substrate having a surface region characterized by an m-plane or related off-cut. The related off-cut includes at least {60-61} or {40-41}. The first FWHM is less than 20% than the second FWHM in an example. Therefore, the above description and illustrations should not be taken as limiting the scope of the present disclosure which is defined by the appended claims.

What is claimed is:
1. An optical device comprising:
a gallium and nitrogen containing member having a semipolar crystalline surface region characterized by a {30-3-1} surface orientation or an offcut of the {30-3-1} plane;
a laser stripe region formed overlying a portion of the semipolar crystalline surface region, the laser stripe region being characterized by a cavity orientation substantially parallel to the projection of the c-direction, the laser stripe region having a first end and a second end;
a first facet provided on the first end of the laser stripe region;
a second facet provided on the second end of the laser stripe region;
an n-type cladding region overlying the semipolar crystalline surface region;
an active region comprising at least one active layer overlying the n-type cladding region; the at least one active layer comprising a quantum well region or a double hetero-structure region; and
a p-type cladding region overlying the active region;
wherein the active layer region is configured to emit electromagnetic radiation characterized by a wavelength ranging from about 430 nm to about 475 nm;
wherein the surface orientation is inclined from (30-3-1) within −3 degrees to +2 degrees about the in-plane [11-20] direction toward an m-plane, wherein the m-plane is a (10-10) plane, the −3 degrees to +2 degrees corresponding to an inclination of approximately 8 degrees and 13 degrees, respectively, from the m-plane about the in-plane [11-20] direction; and wherein the surface orientation is inclined from (30-3-1) within −10 degrees to +10 degrees about the in-plane projection of the [0001] direction.
2. The device of claim 1, wherein a total thickness of the at least one active layer is greater than 15 nm, greater than 25 nm, or greater than 35 nm.
3. The device of claim 1, wherein a total thickness of the active layer region is greater than 15 nm; and wherein the active region comprises at least three quantum well regions.
4. The device of claim 1 wherein:
a total thickness of the at least one active layer is greater than 20 nm or greater than 25 nm; and
the active region comprises at least five quantum wells.

5. The device of claim 1, wherein the each of the quantum well regions comprises a plurality of barrier layers separating a plurality of active layers, each of the barrier layers having a thickness from 2 nm to 4 nm or from 4 nm and 8 nm.
6. The device of claim 1, wherein the p-type cladding region is substantially free from aluminum.
7. The device of claim 1, wherein the n-type cladding region is substantially free from aluminum.
8. The device of claim 1, wherein the p-cladding region is deposited at a growth temperature of greater than 100 degrees Celsius or greater than 150 degrees Celsius higher than the growth temperature of the active layers in the active region.
9. The device of claim 1, wherein:
a total thickness of the active region is greater than 25 nm;
the active region comprises active layers comprising an InN mole fraction of between 0.15% and 0.25%; and
the active region layers comprise an average linear density of misfit dislocations measured in the in-plane direction perpendicular to the in-plane [11-20] of less than $1 \times 10^5$ $cm^{-1}$.
10. The device of claim 1, wherein:
a total thickness of the active region is greater than 40 nm;
the active region comprises layers comprising an InN mole fraction of between 0.05% and 0.20%; and
the active region layers comprises an average linear density of misfit dislocations measured in the in-plane direction perpendicular to the in-plane [11-20] of less than $1 \times 10^5$ $cm^{-1}$.
11. The device of claim 1, wherein:
the first facet is substantially parallel to the second facet; and
the first facet comprises a first mirror surface characterized by a scribed and broken region or by an etched region.
12. The device of claim 1 wherein:
a cavity length of the laser stripe region ranges from about 100 microns to about 2,000 microns; and
a cavity width of the laser stripe region ranges from about 1 micron to about 25 microns.
13. The device of claim 1, wherein:
a separate confinement hetero-structure overlies the n-type cladding region and underlies the active region; and
the separate confinement hetero-structure comprises InGaN with an InN mol fraction ranging from 1% to 10% and a thickness ranging from 10 nm to 200 nm.
14. An optical device comprising:
a gallium and nitrogen containing member having a semipolar crystalline surface region characterized by {30-3-1} surface orientation or an offcut of the {30-3-1} plane;
a laser stripe region formed overlying a portion of the semipolar crystalline surface region, the laser stripe region being characterized by a cavity orientation substantially parallel to the projection of the c-direction, the laser stripe region having a first end and a second end;
a first facet provided on the first end of the laser stripe region;
a second facet provided on the second end of the laser stripe region;
an n-type cladding region overlying the semipolar crystalline surface region, the n-type cladding region being substantially free of Al-bearing species;
an active region comprising at least one active layer region overlying the n-type cladding region, wherein a total thickness of the at least one active layer region is greater than or equal to 10 nm, and the active region comprises a quantum well region or a double hetero-structure region;

a p-type cladding region overlying the active layer region, the p-type cladding region being substantially free of Al-bearing species;
wherein the at least one active layer region is configured to emit electromagnetic radiation characterized by a wavelength ranging from about 430 nm to about 475 nm;
wherein the surface orientation is inclined from (30-3-1) within −3 degrees to +2 degrees about the in-plane [11-20] direction toward an m-plane, wherein the m-plane is a (10-10) plane, the −3 degrees to +2 degrees corresponding to an inclination of approximately 8 degrees and 13 degrees, respectively, from the m-plane about the in-plane [11-20] direction.

15. The device of claim 14, further comprising a p-cladding region configured overlying the active region, wherein the p-cladding region is deposited at a growth temperature of greater than 100 degrees Celsius or greater than 150 degrees Celsius higher than the growth temperature of the at least one active layer region of the active region.

16. The device of claim 14 wherein:
a total thickness of the active region is greater than 15 nm or 25 nm; and
the active region comprises at least three or at least five quantum wells.

17. The device of claim 14, wherein:
the first facet is substantially parallel with the second facet; and
the first facet comprises a first mirror surface characterized by a scribed and broken region or by an etched region.

18. An optical device comprising:
a gallium and nitrogen containing member having a semipolar crystalline surface region characterized by a {30-3-1} surface orientation or offcut of the {30-3-1} plane;
a laser stripe region formed overlying a portion of the semipolar crystalline surface region, the laser stripe region being characterized by a cavity orientation substantially parallel to the projection of the c-direction, the laser stripe region having a first end and a second end;
a first facet provided on the first end of the laser stripe region;
a second facet provided on the second end of the laser stripe region;
an n-type cladding region overlying the semipolar crystalline surface region, the n-type cladding region being substantially free of Al-bearing species;
an active region comprising at least one active layer region overlying the n-type cladding region, wherein a total thickness of the at least one active layer region is greater than or equal to 20 nm; and
a p-type cladding region overlying the at least one active layer region, the p-type cladding region being substantially free of Al-bearing species;
wherein the at least one active layer region is configured to emit electromagnetic radiation characterized by a wavelength ranging from about 430 nm to about 470 nm;
wherein the surface orientation is inclined from (30-3-1) within −3 degrees to +2 degrees about the in-plane [11-20] direction toward an m-plane, wherein the m-plane is a (10-10) plane, the −3 degrees to +2 degrees corresponding to an inclination of approximately 8 degrees and 13 degrees, respectively, from the m-plane about the in-plane [11-20] direction.

19. A method for manufacturing an optical device, the method comprising:
providing a gallium and nitrogen containing member having a semipolar crystalline surface region characterized by a {30-3-1} surface orientation or an offcut of the {30-3-1} plane;
forming a laser stripe region overlying a portion of the semipolar crystalline surface region, the laser stripe region characterized by a cavity orientation substantially parallel to the projection of the c-direction, the laser stripe region having a first end and a second end, the first end having a first etched facet and the second end having a second etched facet;
forming an n-type cladding region over the semipolar crystalline surface region, the n-type cladding region being substantially free of Al-bearing species;
forming an active region comprising at least one active layer region overlying the n-type cladding region at a first temperature range, the at least one active layer region being configured to emit electromagnetic radiation characterized by a wavelength ranging from about 425 nm to about 475 nm and a total thickness of the at least one active layer region being greater than or equal to 10 nm, the active region comprising a quantum well region or double heterostructure region; and
forming a p-type cladding region overlying the active region using a second temperature range of at least 100 degrees greater than an upper limit of the first temperature range provided during formation of the active region, the p-type cladding region being substantially free of Al-bearing species;
wherein the surface orientation is inclined from (30-3-1) within −3 degrees to +2 degrees about the in-plane [11-20] direction toward an m-plane, wherein the m-plane is a (10-10) plane, the −3 degrees to +2 degrees corresponding, to an inclination of approximately 8 degrees and 13 degrees, respectively, from the m-plane about the in-plane [11-20] direction.

20. The method of claim 19, wherein
a total thickness of the active region is greater than 15 nm or greater than 25 nm; and
the active region comprises at least three quantum well regions or five quantum well regions.

21. The method of claim 19, wherein
the first facet is substantially parallel to the second facet; and
the first facet comprises a first mirror surface.

22. The method of claim 19, wherein the second temperature causes a growth condition to achieve a preferred crystal quality and a resistivity between a metal to semiconductor contact region and/or a resistivity of the p-type cladding region, the second temperature being maintained for at least 10 minutes or at least 20 minutes.

23. An optical device comprising:
a gallium and nitrogen containing member having a semipolar crystalline surface region characterized by a {30-3-1} surface orientation or an offcut of the {30-3-1} plane;
a laser stripe region formed overlying a portion of the semipolar crystalline surface region, the laser stripe region being characterized by a cavity orientation substantially parallel to the projection of the c-direction, the laser stripe region having a first end and a second end;
a first facet provided on the first end of the laser stripe region;
a second facet provided on the second end of the laser stripe region;

an n-type cladding region overlying the semipolar crystalline surface region, the n-type cladding region being substantially free of Al-bearing species;

an active region comprising at least one active layer region overlying the n-type cladding region, a total thickness of the at least one active layer region greater than or equal to 15 nm;

a p-type cladding region overlying the active region, the p-type cladding region being substantially free of Al-bearing species; wherein the p-cladding region is deposited at a growth temperature of greater than 100 degrees Celsius higher than a growth temperature of the active layers in the active region;

the at least one active layer region is configured to emit electromagnetic radiation characterized by a wavelength ranging from about 430 nm to about 470 nm; and the surface orientation is inclined from (30-3-1) within −3 degrees to +2 degrees about the in-plane [11-20] direction toward an m-plane, wherein the m-plane is a (10-10) plane, the −3 degrees to +2 degrees corresponding to an inclination of approximately 8 degrees and 13 degrees, respectively, from the m-plane about the in-plane [11-20] direction.

24. The device of claim 23, wherein the first facet and the second facet are characterized by an etched region.

25. The device of claim 18, wherein the first facet and the second facet are characterized by an etched region.

* * * * *